US009768226B2

(12) United States Patent
Sakata et al.

(10) Patent No.: US 9,768,226 B2
(45) Date of Patent: Sep. 19, 2017

(54) SOLID-STATE IMAGING DEVICE

(71) Applicant: Panasonic Corporation, Osaka (JP)

(72) Inventors: Yusuke Sakata, Osaka (JP);
Mitsuyoshi Mori, Kyoto (JP); Yutaka
Hirose, Kyoto (JP); Hiroshi Masuda,
Niigata (JP); Hitoshi Kuriyama, Osaka
(JP); Ryohei Miyagawa, Kyoto (JP)

(73) Assignee: PANASONIC INTELLECTUAL
PROPERTY MANAGEMENT CO.,
LTD., Osaka (JP)

( * ) Notice: Subject to any disclaimer, the term of this patent is extended or adjusted under 35 U.S.C. 154(b) by 85 days.

(21) Appl. No.: 14/132,067

(22) Filed: Dec. 18, 2013

(65) Prior Publication Data
US 2014/0103400 A1 Apr. 17, 2014

Related U.S. Application Data

(63) Continuation of application No. PCT/JP2012/003710, filed on Jun. 6, 2012.

(30) Foreign Application Priority Data

Jun. 23, 2011 (JP) .................. 2011-139944

(51) Int. Cl.
H04N 3/14 (2006.01)
H01L 27/14 (2006.01)
(Continued)

(52) U.S. Cl.
CPC .... H01L 27/14806 (2013.01); H01L 27/1463 (2013.01); H01L 27/14643 (2013.01);
(Continued)

(58) Field of Classification Search
CPC ............. H01L 21/76886; H01L 23/485; H01L 27/1463; H01L 27/14638; H01L 27/14643;
(Continued)

(56) References Cited

U.S. PATENT DOCUMENTS 4,621,275 A 11/1986 Ueno et al.
5,929,469 A * 7/1999 Mimoto ............ H01L 27/11807
257/207
(Continued)

FOREIGN PATENT DOCUMENTS

JP 59-202777 11/1984
JP 01-241864 9/1989
(Continued)

OTHER PUBLICATIONS

International Search Report issued Aug. 14, 2012 in International (PCT) Application No. PCT/JP2012/003710.

Primary Examiner — Cheung Lee
Assistant Examiner — Stephen C Smith
(74) Attorney, Agent, or Firm — McDermott Will & Emery LLP

(57) ABSTRACT

A solid-state imaging device includes: a first electrode formed above a semiconductor substrate; a photoelectric conversion film formed on the first electrode and for converting light into signal charges; a second electrode formed on the photoelectric conversion film; a charge accumulation region electrically connected to the first electrode and for accumulating the signal charges converted from the light by the photoelectric conversion film; a reset gate electrode for resetting the charge accumulation region; an amplification transistor for amplifying the signal charges accumulated in the charge accumulation region; and a contact plug in direct contact with the charge accumulation region, comprising a semiconductor material, and for electrically connecting to (Continued)

each other the first electrode and the charge accumulation region.

22 Claims, 20 Drawing Sheets

(51) Int. Cl.
*H01L 27/148* (2006.01)
*H01L 27/146* (2006.01)
*H01L 21/768* (2006.01)
*H01L 23/485* (2006.01)

(52) U.S. Cl.
CPC .. *H01L 27/14665* (2013.01); *H01L 21/76886* (2013.01); *H01L 23/485* (2013.01); *H01L 2924/0002* (2013.01)

(58) Field of Classification Search
CPC ......... H01L 27/14665; H01L 27/14806; H01L 27/14812
See application file for complete search history.

(56) References Cited

U.S. PATENT DOCUMENTS

| | | |
|---|---|---|
| 6,417,023 B2 | 7/2002 | Suzuki et al. |
| 6,423,993 B1 | 7/2002 | Suzuki et al. |
| 8,178,912 B2 | 5/2012 | Hwang |
| 8,368,784 B2 | 2/2013 | Yamaguchi |
| 8,390,036 B2 | 3/2013 | Goto |
| 2001/0015435 A1 | 8/2001 | Suzuki et al. |
| 2005/0263839 A1* | 12/2005 | Suzuki .............. H01L 27/14636 257/430 |
| 2009/0065829 A1 | 3/2009 | Kim |
| 2009/0166689 A1 | 7/2009 | Hwang |
| 2010/0203670 A1* | 8/2010 | Ohtani .............. H01L 21/76895 438/98 |
| 2011/0019042 A1* | 1/2011 | Yamaguchi ....... H01L 27/14632 348/280 |
| 2011/0049665 A1 | 3/2011 | Goto |
| 2011/0149104 A1* | 6/2011 | Mabuchi ................... 348/222.1 |
| 2011/0156104 A1* | 6/2011 | Yamaguchi ....... H01L 27/14603 257/222 |
| 2012/0200752 A1 | 8/2012 | Matsunaga |
| 2012/0300102 A1* | 11/2012 | Tamura ............. H01L 27/14607 348/294 |
| 2013/0033628 A1 | 2/2013 | Yamaguchi |

FOREIGN PATENT DOCUMENTS

| | | |
|---|---|---|
| JP | 2000-299453 | 10/2000 |
| JP | 2002-299475 | 10/2002 |
| JP | 2006-120922 | 5/2006 |
| JP | 2009-071310 | 4/2009 |
| JP | 2009-188380 | 8/2009 |
| JP | 4444371 | 3/2010 |
| JP | 2011-029337 | 2/2011 |
| WO | 2011/058684 | 5/2011 |

* cited by examiner

SOLID-STATE IMAGING DEVICE

CROSS REFERENCE TO RELATED APPLICATIONS

This is a continuation application of PCT International Application No. PCT/JP2012/003710 filed on Jun. 6, 2012, designating the United States of America, which is based on and claims priority of Japanese Patent Application No. 2011-139944 filed on Jun. 23, 2011. The entire disclosures of the above-identified applications, including the specifications, drawings and claims are incorporated herein by reference in their entirety.

FIELD

The present disclosure relates to a solid-state imaging device including a plurality of pixels which are arranged in a matrix and each of which includes a photoelectric conversion unit.

BACKGROUND

In recent years, MOS (Metal Oxide Semiconductor) solid-state imaging devices are mounted in mobile cameras, in-vehicle cameras, and monitoring cameras.

These solid-state imaging devices are required to capture images at high resolution, and miniaturization and higher pixel counts are necessary for the solid-state imaging devices. In conventional solid-state imaging devices, the size of a photodiode is also reduced due to a finer pixel. This has caused a problem that the saturation signal level is reduced by decreasing the volume of a photodiode, and sensitivity is reduced by decreasing the aperture ratio.

As a solid-state imaging device for solving such a problem, a layered solid-state imaging device is proposed. The layered solid-state imaging device has a photoelectric conversion film stacked on the top surface of a semiconductor substrate. Furthermore, light is incident from above the layered films. The solid-state imaging device has a structure in which charges generated in the photoelectric conversion film by photoelectric conversion are read out using a Charge Coupled Device (CCD) circuit or a Complementary MOS (CMOS) circuit.

Patent Literature (PTL) 1 discloses a conventional layered solid-state imaging device. FIG. 13 illustrates a circuit diagram of a pixel circuit in the solid-state imaging device described in PTL 1. The pixel circuit shown in FIG. 13 has a charge accumulation region (FD) and a pixel electrode 15*a* electrically connected to each other, and the voltage varies depending on the incident light intensity. Furthermore, the charge accumulation region is electrically connected to a gate electrode of an amplification transistor 17*b*. With this, the pixel circuit is capable of amplifying an amount of voltage change in the charge accumulation region to read out the resulting voltage to a signal line 17*d*.

In the foregoing layered solid-state imaging device, although the photoelectric conversion film is stacked on the top of a wiring layer used in a reading out circuit and a signal processing circuit, the charges generated by photoelectric conversion are accumulated in the charge accumulation region provided in the semiconductor substrate. This is why the charges generated by photoelectric conversion are transmitted to the charge accumulation region via metal plugs.

CITATION LIST

Patent Literature

[PTL 1] Japanese Patent No. 4444371

SUMMARY

Technical Problem

However, the conventional technique has a problem of increasing noise because crystal defects increase at the contact interface between a charge accumulation region and a metal plug due to a silicon alloying reaction.

In view of this, the present disclosure provides a solid-state imaging device which reduces noise by suppressing crystal defects caused by an alloying reaction.

Solution to Problem

In order to solve such a problem, a solid-state imaging device according to one embodiment of the present disclosure is a solid-state imaging device including a plurality of pixels arranged in a matrix, the solid-state imaging device including: a semiconductor substrate; a first electrode formed above the semiconductor substrate for each of the pixels, and electrically isolated from an adjacent one of the pixels; a photoelectric conversion film formed on the first electrode, the photoelectric conversion film converting light into signal charges; a second electrode formed on the photoelectric conversion film; a charge accumulation region formed in the semiconductor substrate for each of the pixels, and electrically connected to the first electrode in the pixel, the charge accumulation region accumulating the signal charges converted from the light by the photoelectric conversion film; a reset gate electrode formed for each of the pixels, the reset gate electrode resetting the charge accumulation region; an amplification transistor formed for each of the pixels, the amplification transistor amplifying the signal charges accumulated in the charge accumulation region in the pixel; and a contact plug formed, for each of the pixels, in direct contact with the charge accumulation region and comprising a semiconductor material, the contact plug being for electrically connecting to each other the first electrode and the charge accumulation region in the pixel.

With this, in the solid-state imaging device according to one embodiment of the present disclosure, a semiconductor material is used for the contact plug for electrically connecting to each other the photoelectric conversion unit and the charge accumulation region which are essentials in a layered solid-state imaging device. As a result, an alloying reaction does not occur at the contact interface between the charge accumulation region and the contact plug. Thus, the solid-state imaging device can reduce the crystal defects generated in a contact portion between the charge accumulation region and the contact plug, thereby decreasing noise.

Advantageous Effects

As described above, the present disclosure provides a solid-state imaging device which can reduce noise by suppressing crystal defects caused by an alloying reaction.

BRIEF DESCRIPTION OF DRAWINGS

These and other objects, advantages and features of the disclosure will become apparent from the following description thereof taken in conjunction with the accompanying drawings that illustrate a specific embodiment of the present invention.

DESCRIPTION OF EMBODIMENTS

Figure 1:
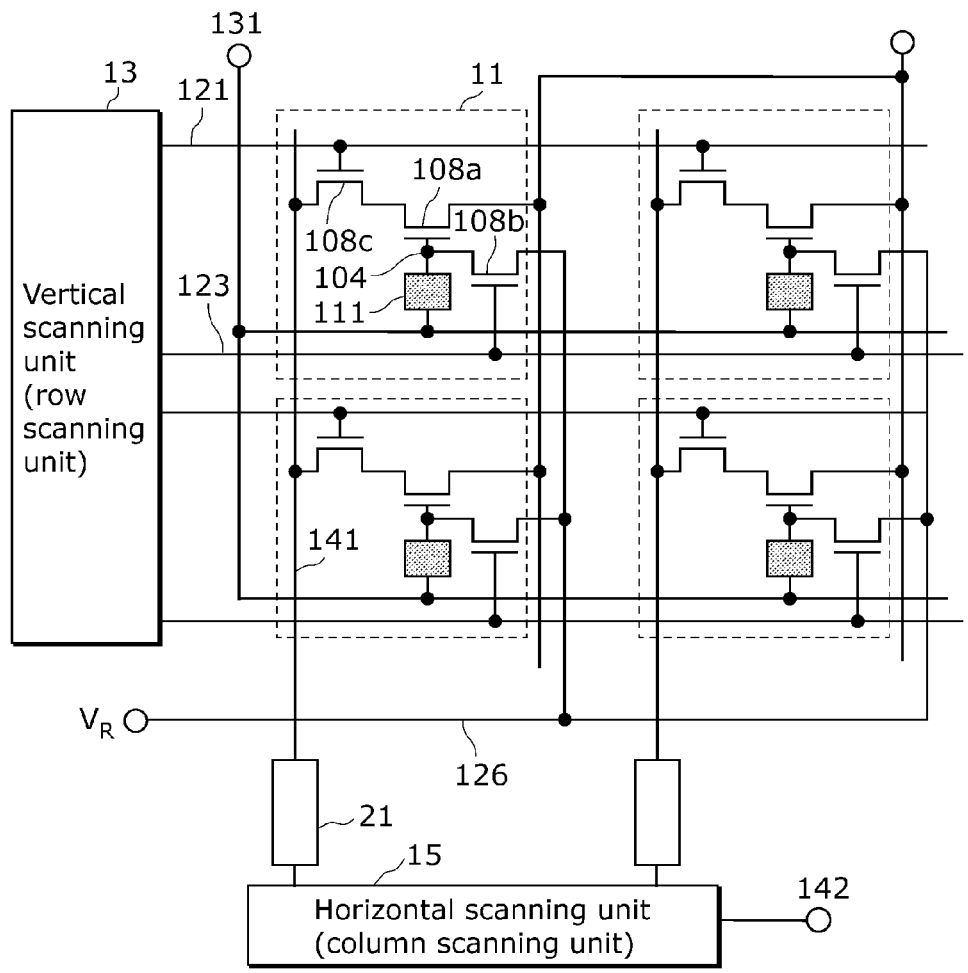
FIG. 1 illustrates a circuit diagram showing a solid-state imaging device according to an embodiment 1 of the present disclosure.

Hereinafter, the exemplary embodiments of the present disclosure are described in detail with reference to the accompanying Drawings. It should be noted that the present disclosure is not limited to the following embodiments. Furthermore, it is possible to advantageously change them as long as they are within the scope of the advantageous effect of the present disclosure. It is also possible to combine with another embodiment. Furthermore, any one of the embodiments to be described below is for showing a mere example of the present disclosure. The numerical values, shapes, materials, constituent elements, the arrangement and connection of the constituent elements, steps, the processing order of the steps etc. shown in the following embodiments are mere examples, and thus do not limit the present disclosure. Furthermore, among the constituent elements in the following embodiments, constituent elements not recited in any of the independent claims indicating the most generic concept of the present disclosure are described as preferable constituent elements.

Embodiment 1

Concentrated implantation into a charge accumulation region, which is necessary for the layered solid-state imaging device disclosed in PTL 1, enhances an electric field across a P-N junction, and this causes leakage current. In addition, the leakage current further increases when a sharp P-N junction is formed on an isolation region interface and a substrate surface each having a high density of crystal defects.

Furthermore, like a conventional surface-illuminated solid-state imaging device, a method of accumulating, in an N-type charge accumulation region, electrons which are generated in a silicon photodiode by photoelectric conversion requires a high reset voltage to increase a saturation charge level, and the leakage current increases under a dark condition. In contrast, a low reset voltage causes a problem of lacking the number of electrons per pixel.

Furthermore, in the layered solid-state imaging device disclosed in PTL 1, under an illumination condition, light leaks through a photoelectric conversion film to a substrate, and thus noise is generated when the leaked light is converted into electrons in the charge accumulation region inside the substrate.

The present disclosure is intended to solve the problems of increasing noise, increasing leakage current, and lacking the number of electrons per pixel as described above.

In a solid-state imaging device according to an embodiment 1 of the present disclosure, a semiconductor material is used for a contact plug for electrically connecting to each other a photoelectric conversion film and a charge accumulation region which are essentials in a layered solid-state imaging device. As a result, an alloying reaction does not occur at the contact interface between the charge accumulation region and the contact plug. Thus, the solid-state imaging device can reduce crystal defects generated in a contact portion between the charge accumulation region and the contact plug, thereby decreasing noise.

First, a structure of the solid-state imaging device according to the embodiment 1 of the present disclosure is described. FIG. 1 illustrates a circuit diagram showing the structure of the solid-state imaging device according to the embodiment 1 of the present disclosure As shown in FIG. 1, the solid-state imaging device according to the embodiment 1 of the present disclosure includes a semiconductor substrate 101, a plurality of pixels 11 arranged in a matrix above the semiconductor substrate 101, a vertical scanning unit 13 (also referred to as a row scanning unit) for providing various timing signals to the pixels 11, a horizontal scanning unit 15 (also referred to as a column scanning unit) for sequentially reading out signals from the pixels to a horizontal output terminal 142, column signal lines 141 formed for respective columns, and reset lines 126 provided for respective columns to reset the pixels 11 to states under the dark condition. It should be noted that the "2×2" pixels 11 are shown in FIG. 1, but the number of rows and columns may be determined advantageously.

Furthermore, each of the pixels 11 includes a photoelectric conversion unit 111, an amplification transistor 108a having a gate connected to the photoelectric conversion unit 111, a reset transistor 108b having a drain connected to the photoelectric conversion unit 111, and a selection transistor 108c connected in series to the amplification transistor 108a.

The photoelectric conversion unit 111 includes a photoelectric conversion film for converting light into electrons, a pixel electrode formed on a surface of the photoelectric conversion film facing to the semiconductor substrate, and a transparent electrode formed on the opposite surface of the photoelectric conversion film. This photoelectric conversion unit 111 is connected between a control line 131 for the photoelectric conversion unit and the gate of the amplification transistor 108a, i.e. the drain of the reset transistor 108b. The amplification transistor 108a has a gate connected to the pixel electrode, and provides a signal voltage corresponding to a voltage of the pixel electrode to the column signal line 141 via the selection transistor 108c. The reset transistor 108b has a source and the drain one of which is connected to the pixel electrode, and the other of which is connected to a corresponding reset line 126. The selection transistor 108c has a gate connected to the vertical scanning unit 13 via an address control line 121. The reset transistor 108b has a gate connected to the vertical scanning unit 13 via a reset control line 123. The address control line 121 and the reset control line 123 are provided for each of the rows.

In the embodiment, as an example, it is assumed that the reset transistor 108b is an N-type MOS transistor, a reset pulse in a reset signal provided to the gate of the reset transistor is a positive pulse (upward pulse), and the rear edge (back edge) of the reset pulse is a falling edge.

The control line 131 for the photoelectric conversion unit is shared by all the pixels. The column signal line 141 is provided for each of the columns, and connected to the horizontal scanning unit 15 via a column signal processing unit 21. The column signal processing unit 21 performs analog-to-digital conversion, signal processing for suppressing noise as represented by correlated double sampling, and others.

Furthermore, when the reset transistor 108b is in a conduction state, the voltage in the charge accumulation region 104 is 0 V or a positive voltage of approximately 0 V.

Figure 2:
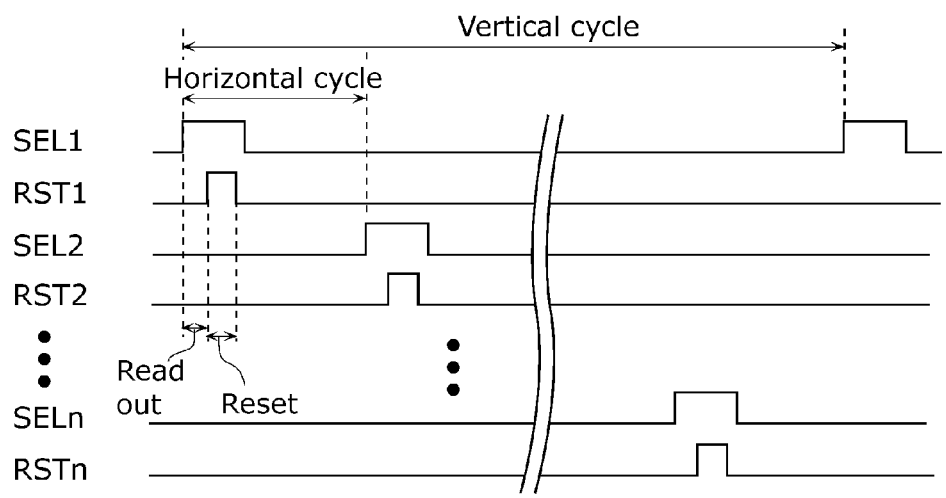
FIG. 2 illustrates a timing chart showing an operation of the solid-state imaging device according to the embodiment 1 of the present disclosure.

FIG. 2 illustrates a timing chart showing the most basic imaging operation of the solid-state imaging device according to the embodiment. In FIG. 2, SEL1 denotes a row selection signal for the first row. RST1 denotes a row reset signal for the first row. SEL2 and RST2 differ from SEL1 and RST1 only in that a corresponding row is different, respectively. One horizontal cycle is a period from a time point in which the row selection signal is enabled to a time point in which the next row selection signal is enabled (from a rising edge of SEL1 to a rising edge of SEL2), and a period required to read out the signal voltages from the pixels in a single row. One vertical cycle is a period required to read out the signal voltages from the pixels in all the rows.

Furthermore, the amplification transistor 108a, the selection transistor 108c, and the reset transistor 108b are formed on the semiconductor substrate comprising silicon. The amplification transistor 108a has a gate electrode, the drain which is a diffusion layer, and the source which is a diffusion layer. The selection transistor 108c has a gate electrode, the drain which is a diffusion layer, and the source which is a diffusion layer. The source of the amplification transistor 108a and the drain of the selection transistor 108c are formed in a common diffusion layer. The reset transistor 108b has a gate electrode, the drain which is a diffusion layer, and the source which is a diffusion layer. The amplification transistor 108a and the reset transistor 108b are separated by an element isolation region.

Furthermore, an insulating film is formed on the semiconductor substrate 101 so as to cover the transistors. The photoelectric conversion unit 111 is formed on the insulating film. The photoelectric conversion unit 111 includes: a photoelectric conversion film comprising an organic material, a material including a semiconductor as represented by amorphous silicon and germanium, or the like; the pixel electrode formed on the lower surface of the photoelectric conversion film; and the transparent electrode formed on the upper surface of the photoelectric conversion film. The pixel electrode is connected, via a contact, to the gate electrode of the amplification transistor 108a and the diffusion layer which is the source of the reset transistor 108b. The diffusion layer connected to the pixel electrode acts as the charge accumulation region.

As described above, the solid-state imaging device according to the embodiment includes the photoelectric conversion unit having a large light absorption coefficient, and thus the quantum efficiency is excellent.

Furthermore, in the solid-state imaging device according to the embodiment, the size of the charge accumulation region can be decreased, and thus it is possible to increase a conversion gain in terms of a circuit.

Figure 3:
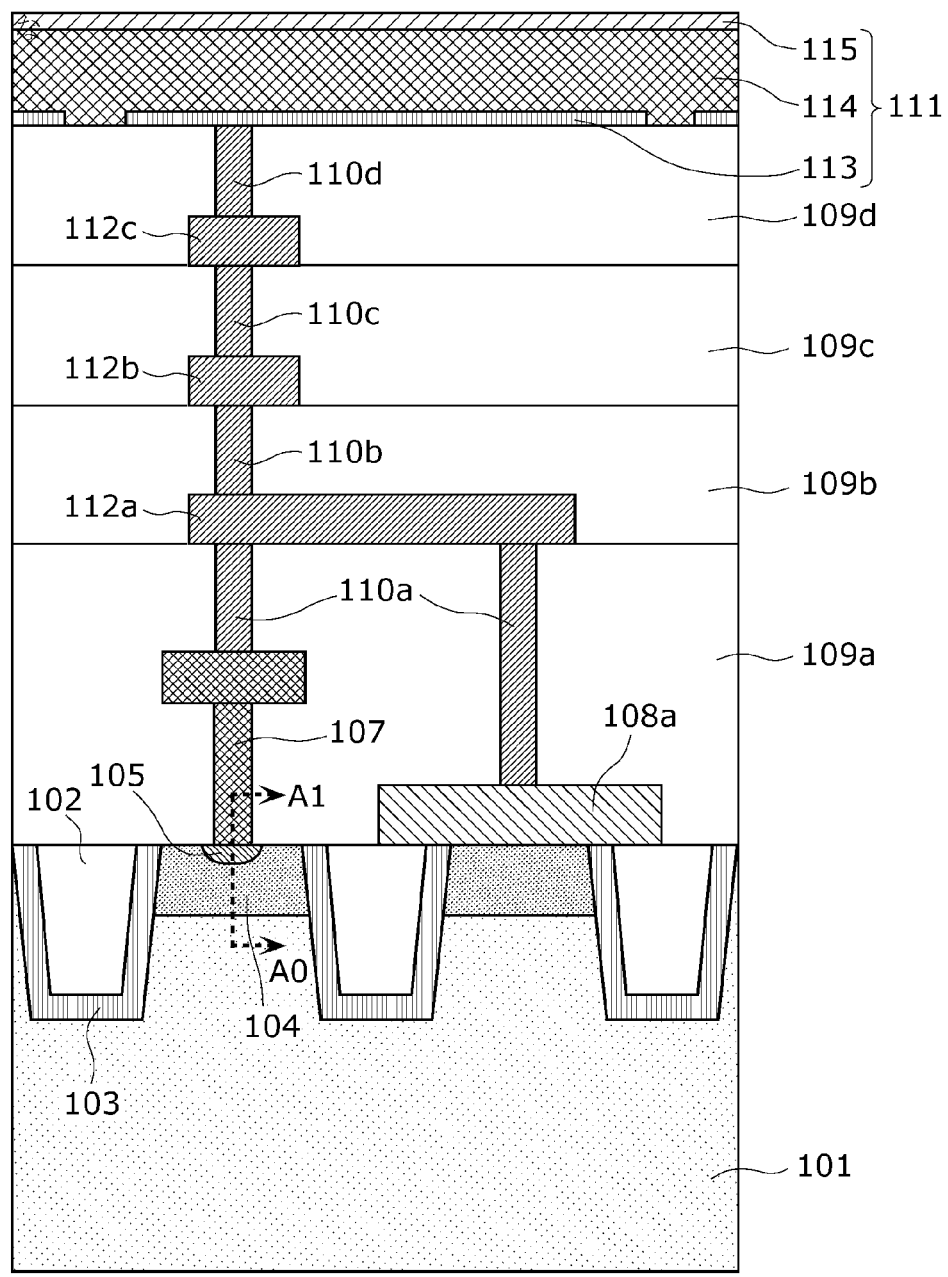
FIG. 3 illustrates a cross-sectional view of the solid-state imaging device according to the embodiment 1 of the present disclosure.

FIG. 3 illustrates a cross-sectional view of a structure including the charge accumulation region 104 and the amplification transistor 108a included in one pixel in the solid-state imaging device according to the embodiment 1 of the present disclosure.

As shown in FIG. 3, the pixel 11 includes: the element isolation region 102 formed by providing an oxide film in the semiconductor substrate 101 to isolate the transistors; a P-type impurity region 103 formed at a periphery of the element isolation region 102 to suppress the leakage current caused by an interface of the element isolation region 102; the N-type charge accumulation region 104 for accumulating the signal charges from the photoelectric conversion film 114; a contact plug 107 comprising polysilicon which includes N-type impurities at a concentration higher than that in the charge accumulation region 104; an impurity diffusion layer 105 formed by diffusing the N-type impurities from the polysilicon; the gate electrode of the amplification transistor 108a formed on the semiconductor substrate 101 with a gate oxide film (not shown) provided therebetween; metal plugs 110a to 110d which are contact plugs comprising a metal such as W, Cu or Al; insulator layers 109a to 109d; a first electrode 113 (pixel electrode) isolated from the adjacent pixels 11 and connected to the charge accumulation region 104 and the gate electrode of the amplification transistor 108a; the photoelectric conversion film 114 for generating the signal charges corresponding to the amount of incident light; and a second electrode 115 (transparent electrode) for applying to the photoelectric conversion film 114 a predetermined voltage necessary for the photoelectric conversion.

The photoelectric conversion film 114 generates charges according to the amount of light received. The holes of the generated charges are accumulated in the charge accumulation region 104 via the first electrode 113 as the signal charges. On the other hand, the electrons are attracted to the second electrode 115. A voltage applied to the gate electrode of the amplification transistor 108a increases with the amount of the signal charges accumulated in the charge accumulation region 104.

The amplification transistor 108a outuputs a signal voltage based on the signal charges accumulated in the charge accumulation region 104. The signal voltage output by the amplification transistor 108a is provided to the column signal line 141 by applying a predetermined voltage to the gate electrode of the selection transistor 108c.

Furthermore, a voltage of the charge accumulation region 104 is set to a reset voltage by applying a predetermined voltage to the gate electrode of the reset transistor 108b after signal read out.

In the embodiment, the charge accumulation region 104 and the metal plug 110a are connected to each other via the contact plug 107 comprising polysilicon doped to $N^+$-type conductivity. After this contact plug 107 is formed, the impurity diffusion layer 105 is formed by annealing. This impurity diffusion layer 105 can reduce the contact resistance between the contact plug 107 and the charge accumulation region 104. Furthermore, due to the formation of the impurity diffusion layer 105, the charge accumulation region 104 is not required to be $N^+$-type conductivity, and thus the charge accumulation region 104 is formed as $N^-$-type conductivity. Furthermore, the P-type impurity region 103 is formed at the periphery of the element isolation region 102 to prevent the leakage current generated at the interface of the element isolation region 102. It should be noted that the impurity diffusion layer 105 need not be always formed as long as the contact resistance between the contact plug 107 and the charge accumulation region 104 is within an allowable range.

Figure 4:
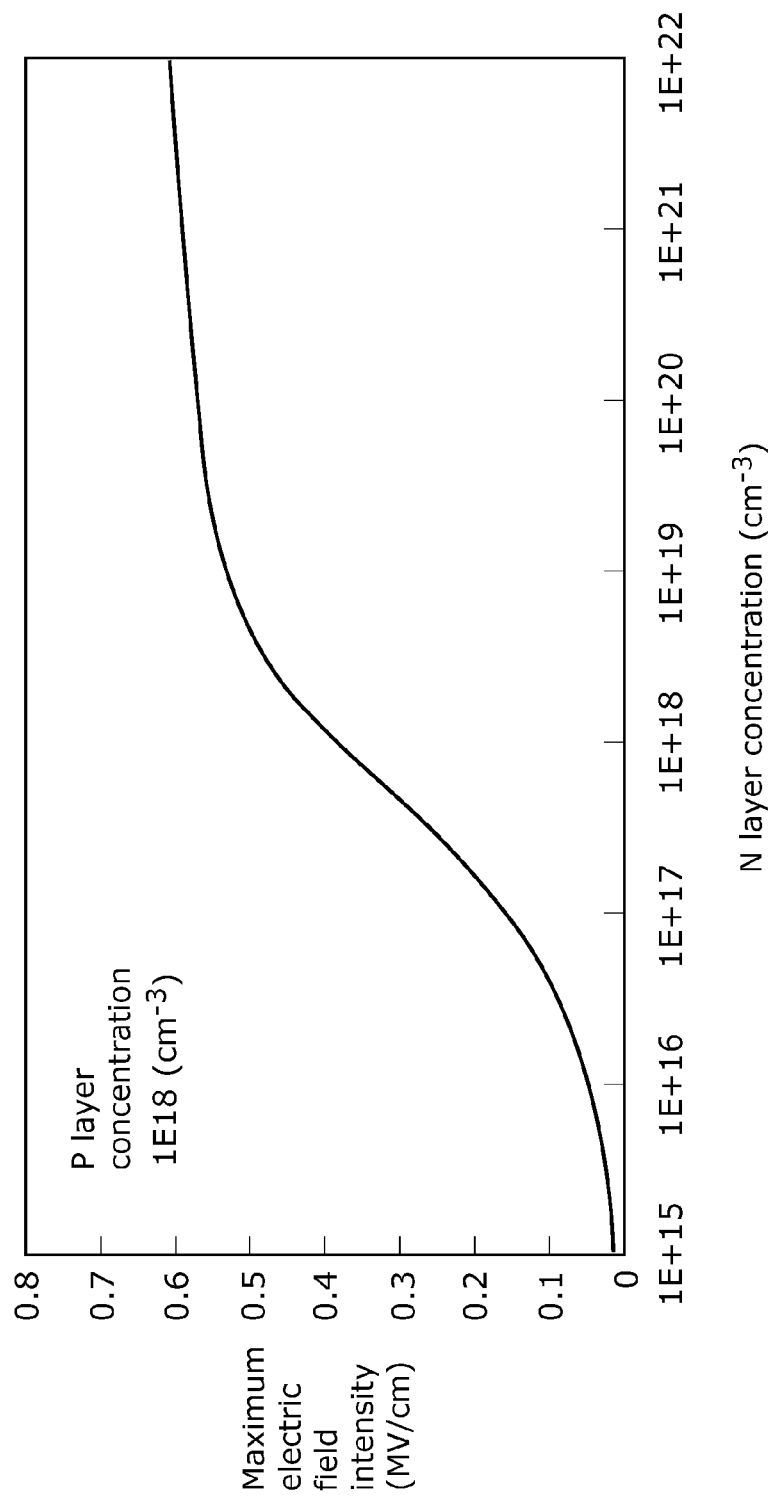
FIG. 4 illustrates a graph showing electric field intensity as a function of an N-layer concentration in a P-N junction, according to the embodiment 1 of the present disclosure.

Here, FIG. 4 shows an electric field intensity at the P-N junction when an impurity concentration in the charge accumulation region 104 is plotted along the horizontal axis. In FIG. 4, it is assumed that the P-type impurity region 103 has a concentration of $10^{18}$ cm$^{-3}$. As shown in FIG. 4, the electric field intensity can be reduced with decreasing the impurity concentration in the charge accumulation region 104. Furthermore, when a strong electric field is applied to the P-N junction, the leakage current caused by TAT (Trap Assisted Tunneling) current is dominant. In this model, the leakage current increases with increasing the electric field intensity. Accordingly, it is found that the reducing of the impurity concentration in the charge accumulation region 104 is effective for the decrease in the leakage current.

In view of the forgoing structure, the charge accumulation region 104 is isolated by the P-type layer from the element isolation region 102 comprising an oxide film. Furthermore, the impurity diffusion layer 105 is minimized which includes impurities at a high concentration and is necessary to reduce the contact resistance. Accordingly, it is possible to suppress the leakage current generated at the periphery of the charge accumulation region 104 as much as possible. Furthermore, this structure has an advantage in miniaturization.

Furthermore, in the embodiment, when the holes are read out, the charge accumulation region 104 which is an N-type impurity region is used. With this, under the illumination condition, a voltage applied between the charge accumulation region 104 and the semiconductor substrate 101 is a reverse-bias voltage. Accordingly, this structure is advantageous in that (i) the leakage current increases less than that of a method of accumulating electrons in the N-type impurity region and (ii) the maximum number of electrons per pixel increases.

Furthermore, in the embodiment, a thick polysilicon plug is provided between the metal plug 110a and the contact plug 107 comprising polysilicon. This interlayer has an effect to prevent light passing through the photoelectric conversion film 114 from directly entering the charge accumulation region 104. Thus, it is possible to suppress the noise. Furthermore, the thick interlayer can be also used to prevent misalignment between the thin plugs. However, the thick polysilicon plug need not be always formed when the coupling capacity between the adjacent pixels is increased by the thick polysilicon plug and thus color cross-talk is also increased.

Furthermore, in the embodiment, although the polysilicon is used as a material of the contact plug 107, a material including polycrystalline silicon, Ge, or GaAs may be used instead of the polysilicon.

As described above, the solid-state imaging device according to the embodiment 1 of the present disclosure is a solid-state imaging device including a plurality of pixels 11 arranged in a matrix, the solid-state imaging device including: a semiconductor substrate 101; a first electrode 113 formed above the semiconductor substrate 101 for each of the pixels 11, and electrically isolated from an adjacent one of the pixels 11; a photoelectric conversion film 114 formed on the first electrode 113, the photoelectric conversion film converting light into signal charges; a second electrode 115 formed on the photoelectric conversion film 114; a charge accumulation region 104 formed in the semiconductor substrate 101 for each of the pixels 11, and electrically connected to the first electrode 113 in the pixel 11, the charge accumulation region accumulating the signal charges converted from the light by the photoelectric conversion film 114; a reset gate electrode formed for each of the pixels 11, the reset gate electrode resetting the charge accumulation region; an amplification transistor 108a formed for each of the pixels 11, the amplification transistor amplifying the signal charges accumulated in the charge accumulation region 104 in the pixel 11; and a contact plug 107 formed, for each of the pixels 11, in direct contact with the charge accumulation region 104 and comprising a semiconductor material, the contact plug being for electrically connecting to each other the first electrode 113 and the charge accumulation region 104 in the pixel 11.

In the solid-state imaging device according to the embodiment 1 of the present disclosure, a semiconductor material is used for the contact plug for electrically connecting to each other the photoelectric conversion film 114 and the charge accumulation region 104 which are essentials in the layered solid-state imaging device. With this, the alloying reaction does not occur at the contact interface between the charge accumulation region 104 and the contact plug 107. Thus, the solid-state imaging device can reduce the crystal defects generated in the contact portion between the charge accumulation region 104 and the contact plug 107, thereby decreasing the noise.

Furthermore, the charge accumulation region 104 has a conductivity type identical to a conductivity type of the semiconductor material included in the contact plug 107.

With this, there is no difference in potential between the charge accumulation region 104 and the contact plug 107, and thus the contact resistance between the charge accumulation region 104 and the contact plug 107 is reduced.

Furthermore, a concentration of impurities determining the conductivity type of the semiconductor material included in the contact plug 107 is higher than a concentration of impurities determining the conductivity type of the charge accumulation region 104.

With this, it is possible to decrease the potential barrier existing between the charge accumulation region 104 and the contact plug 107, and thus the contact resistance between the charge accumulation region 104 and the contact plug 107 can be further reduced. Furthermore, the contact resistance can be also reduced even when the impurity concentration in the charge accumulation region 104 is lowered, and thus the effect of a reduction in the leakage current due to a lowered concentration in the charge accumulation region 104 can be achieved.

Furthermore, the charge accumulation region 104 includes an impurity diffusion layer 105 in direct contact with the contact plug 107, and a concentration of impurities determining a conductivity type of the impurity diffusion layer 105 is higher than a concentration of impurities determining a conductivity type of a region, other than the impurity diffusion layer 105, included in the charge accumulation region 104.

With this, the contact resistance between the contact plug 107 and the charge accumulation region 104 can be reduced.

Furthermore, the signal charges have polarities opposite to polarities of majority carriers determining a conductivity type of the charge accumulation region 104.

With this, it is possible to decrease the reset voltage between charge accumulation region 104 and the substrate 101 while maintaining the high saturation signal level, and thus the leakage current can be suppressed under the dark condition.

On the other hand, contrary to such a structure, when the signal charges have polarities equivalent to polarities of carriers determining a conductivity type of the charge accumulation region 104, it is needed to make a choice between the two: the leakage current is traded off against the saturation signal level to keep it high by setting the reset voltage to a high reverse-bias voltage; and the saturation signal level is traded off against the leakage current by setting the reset voltage to a low voltage to suppress the leakage current.

Figure 5A:
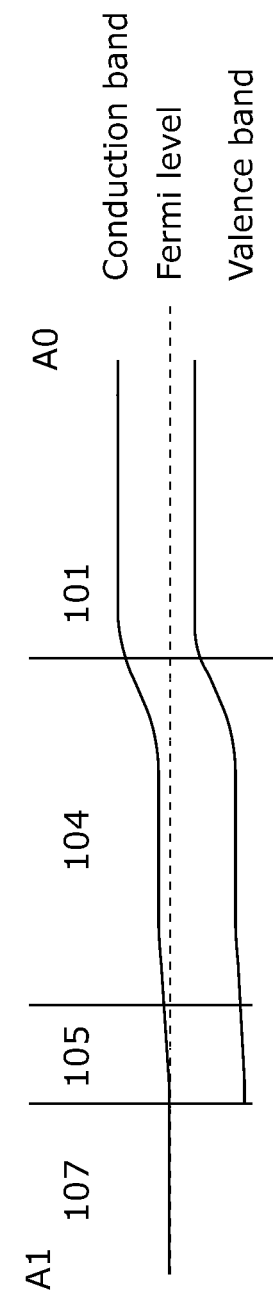
FIG. 5A illustrates a schematic view showing a band structure under a dark condition along a line through a contact plug and a charge accumulation region, for the solid-state imaging device according to the embodiment 1 of the present disclosure.
Figure 5B:
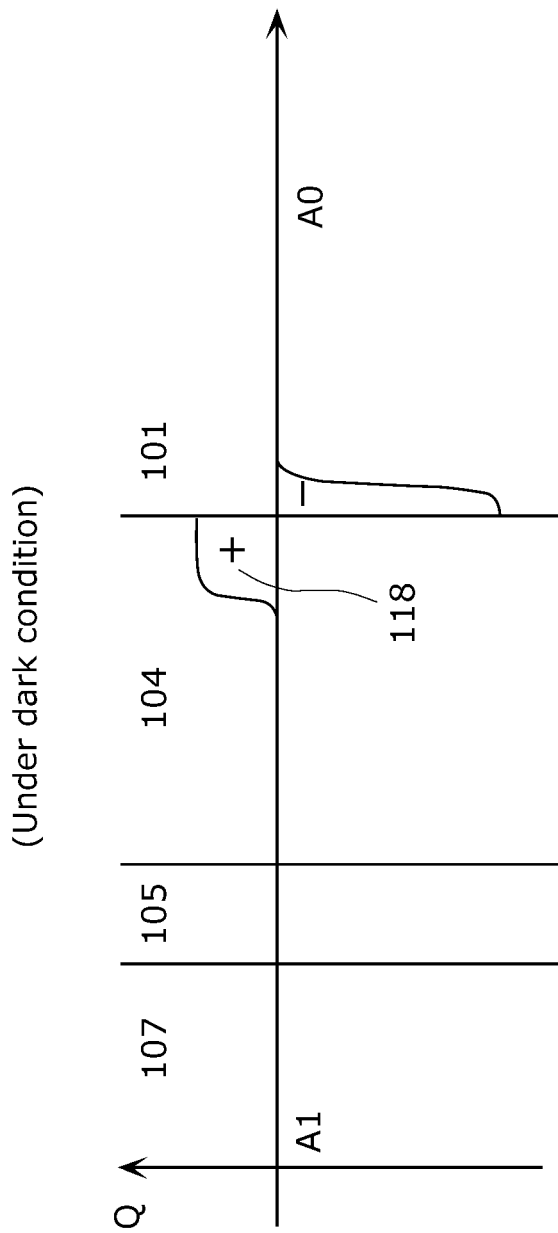
FIG. 5B illustrates a schematic view showing a charge profile under the dark condition along the line through the contact plug and the charge accumulation region, for the solid-state imaging device according to the embodiment 1 of the present disclosure.

The following describes in detail an exemplary structure in which the charge accumulation region 104 is N-type conductivity. In view of the foregoing structure, under the dark condition, the voltage of the charge accumulation region 104 is 0 V or a positive voltage of approximately 0 V. FIG. 5A illustrates a schematic view showing a band structure along a line A0-A1 under the dark condition when the charge accumulation region 104 is formed as the N-type conductivity. In addition, FIG. 5B illustrates a graph showing a charge profile along the line A0-A1. The line A0-A1 refers to a line through the contact plug 107 and the charge accumulation region 104 shown in FIG. 3.

In this case, depletion layer charges 118 are formed in the charge accumulation region 104. Under the dark condition, a difference in potential between the charge accumulation region 104 and the semiconductor substrate 101 is 0 V or approximately 0 V, and thus it is possible to reduce the leakage current between the charge accumulation region 104 and the semiconductor substrate 101. In contrast, under the illumination condition, the charge accumulation region 104 is charged positively.

Figure 5C:
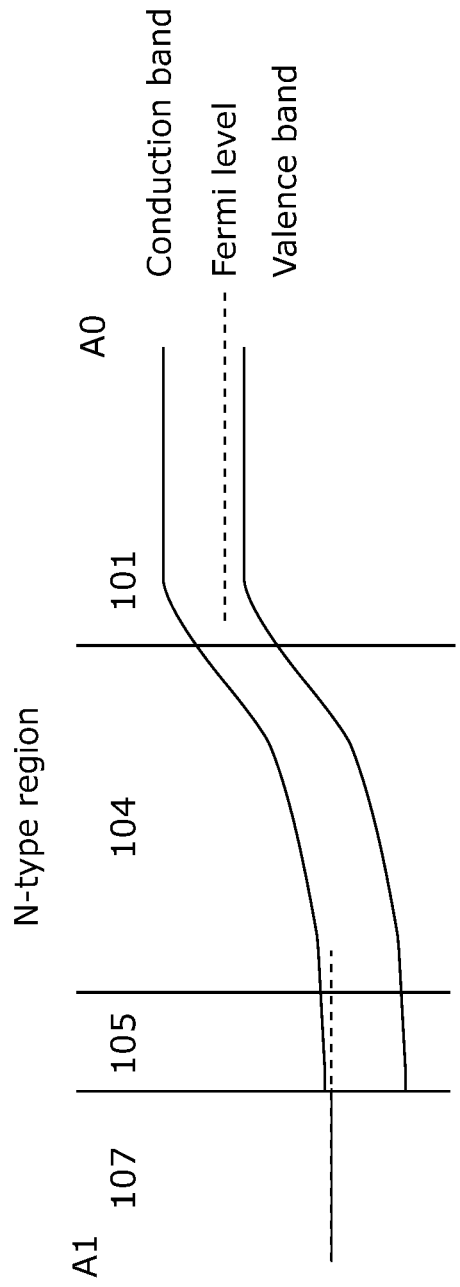
FIG. 5C illustrates a schematic view showing a band structure under an illumination condition along the line through the contact plug and the charge accumulation region, for the solid-state imaging device according to the embodiment 1 of the present disclosure.
Figure 5D:
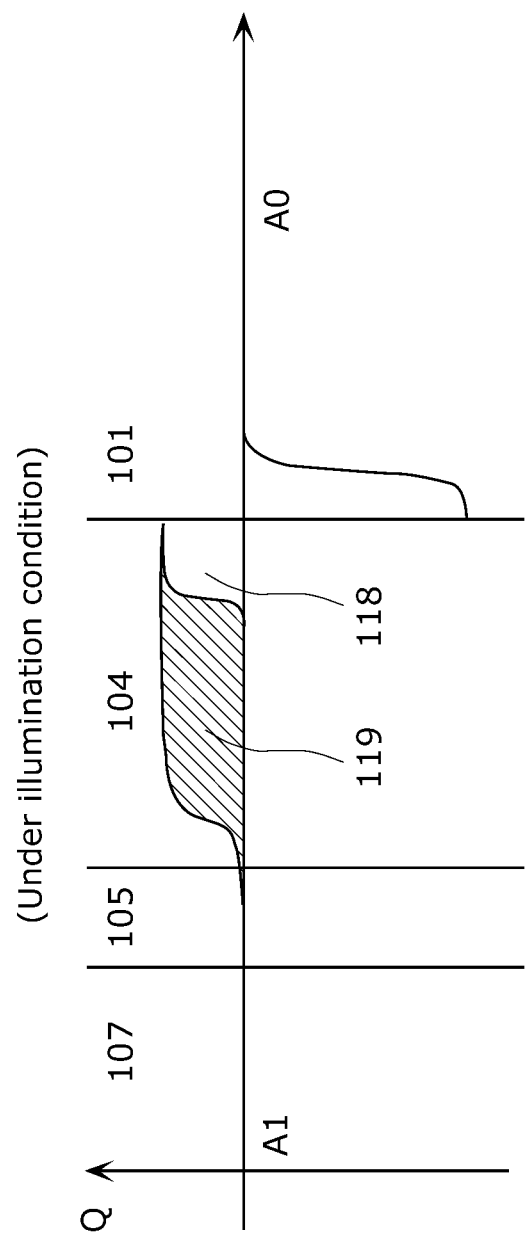
FIG. 5D illustrates a schematic view showing a charge profile under the illumination condition along the line through the contact plug and the charge accumulation region, for the solid-state imaging device according to the embodiment 1 of the present disclosure.

FIG. 5C illustrates a schematic view showing a band structure along the line A0-A1 under the illumination condition when the charge accumulation region 104 is formed as the N-type conductivity. FIG. 5D illustrates a graph showing a charge profile along the line A0-A1.

The signal charges have polarities opposite to polarities of majority carriers in the charge accumulation region 104, and thus the charge profile in FIG. 5D shows a shape in which signal charges 119 formed as space charges is added to the depletion layer charges 118 under the dark condition. As a result, under the illumination condition, a reverse-bias voltage is applied between the charge accumulation region 104 and the semiconductor substrate 101. Accordingly, it is possible to apply a voltage to the charge accumulation region 104 until the voltage reaches the reverse breakdown voltage of the P-N junction, and thus a high saturation signal level can be obtained.

Furthermore, the solid-state imaging device further including: an element isolation region 102 formed in the semiconductor substrate 101 and comprising an insulator, the element isolation region isolating the charge accumulation region 104 from a charge accumulation region 104 in an adjacent one of the pixels and a transistor region in which the amplification transistor 108a is formed; and a P-type impurity region 103 formed between the element isolation region 102 and the charge accumulation region 104 in the semiconductor substrate 101, and having a conductivity type opposite to a conductivity type of the charge accumulation region 104, in which the P-type impurity region 103 has a concentration of impurities that is higher than a concentration of impurities in the charge accumulation region 104 and lower than a concentration of impurities in the contact plug 107.

The element isolation region 102 surrounds the amplification transistor 108a and the selection transistor 108c. The element isolation region 102 also surrounds the charge accumulation region 104 and the reset transistor 108b. Thus, the charge accumulation region 104 is isolated from the adjacent pixels.

Such a structure ensures the insulation of the element isolation region 102 and further makes it possible to suppress the leakage current generated in the element isolation region 102.

Furthermore, the contact plug 107 includes silicon or germanium.

With this, it is possible to suppress a dark current because a material appropriate to a silicon process is selected for a material of the contact plug 107 used to eliminate interface defects at the surface of the charge accumulation region 104.

Embodiment 2

In an embodiment 2 according to the present disclosure, a variation of the embodiment 1 is described.

Figure 6:
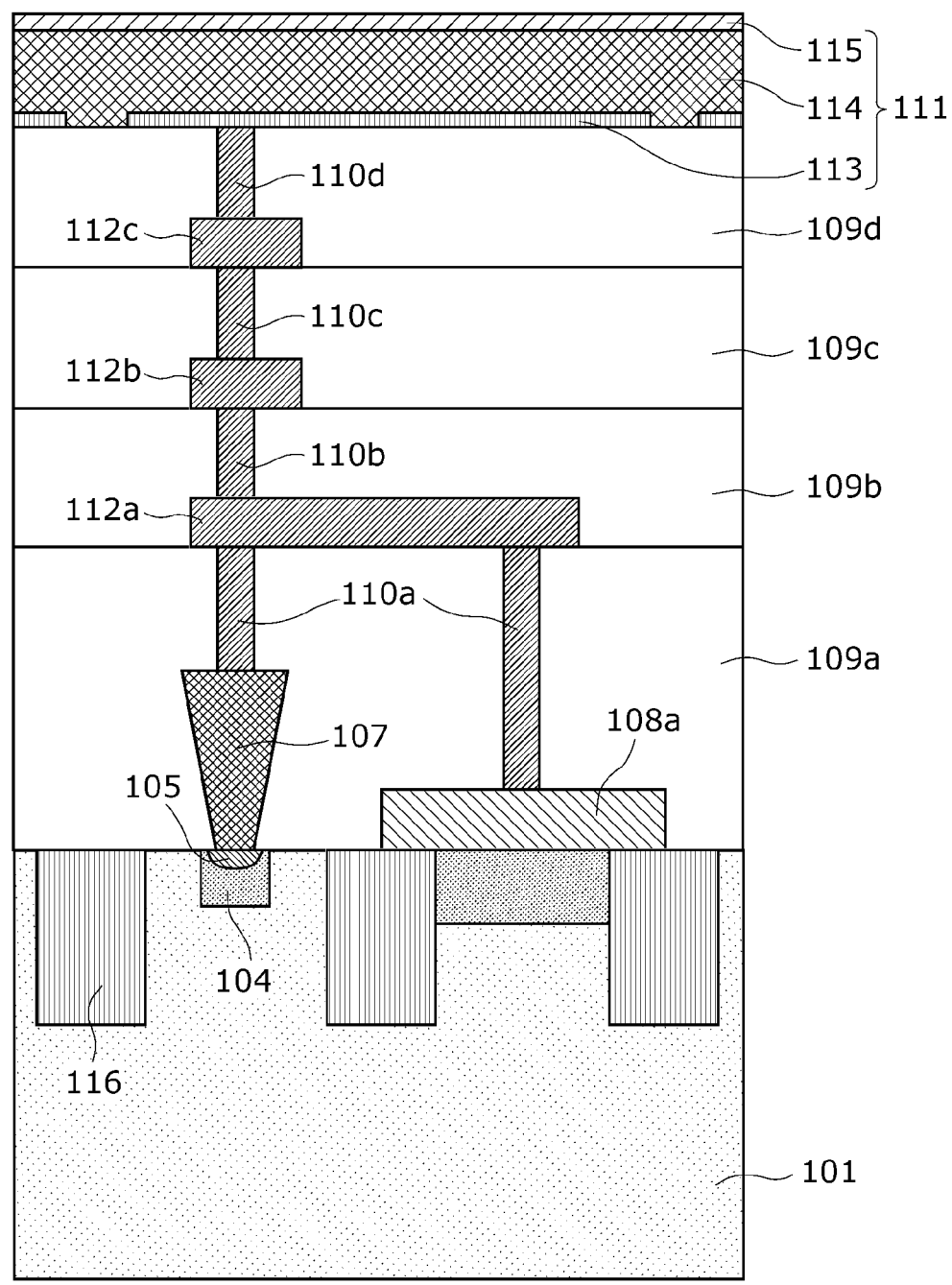
FIG. 6 illustrates a cross-sectional view of the solid-state imaging device according to an embodiment 2 of the present disclosure.

FIG. 6 illustrates a cross-sectional view of a structure including a charge accumulation region 104 and an amplification transistor 108a included in one pixel in the solid-state imaging device according to the embodiment 2 of the present disclosure. It should be noted that an element identical to that in FIG. 3 is numbered the same.

In addition, the following mainly describes differences from the embodiment 1, and the detailed description of the same is omitted.

A structure shown in FIG. 6 includes a P-type impurity region 116 formed to isolate transistor regions from each other, instead of the element isolation region 102 and the P-type impurity region 103 in the structure shown in FIG. 3. Furthermore, a shape of a contact plug 107 and a size of the charge accumulation region 104 are different from those in FIG. 3.

The contact plug 107 comprising polysilicon according to the embodiment has a top width greater than a bottom width thereof. With this, it is possible to prevent a bad connection caused by misalignment which occurs when a metal plug 110a is formed on the contact plug 107.

Furthermore, the charge accumulation region 104 according to the embodiment is minimized. Such a charge accumulation region 104 is formed by implanting impurities through a connect hole before the formation of the contact plug 107. In this method, the charge accumulation region 104 can be formed at a maximum distance from the P-type impurity region 116. However, in order to make a reset transistor 108b operable, a method of shortening a distance between the contact plug 107 and the reset transistor 108b, or a method of forming the charge accumulation region by implanting impurities using another mask from a forming position of the contact plug to the bottom of the gate electrode of the reset transistor may be used.

With this, the solid-state imaging device according to the embodiment can achieve the same effect as the foregoing embodiment 1.

Furthermore, the contact plug 107 has the bottom width smaller than the top width thereof.

This prevents leakage light passing through the photoelectric conversion film 114 from entering the charge accumulation region 104 under an illumination condition, thereby suppressing noise. Furthermore, it is possible to prevent the bad connections.

Figure 7:
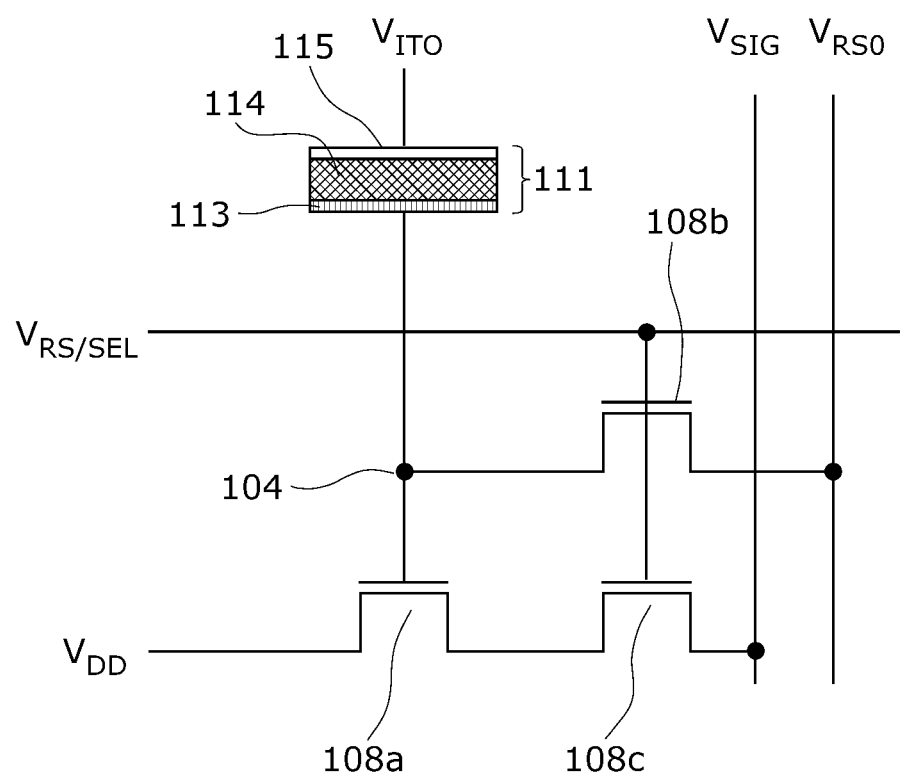
FIG. 7 illustrates a circuit diagram of a pixel circuit according to the embodiment 2 of the present disclosure.

FIG. 7 illustrates a pixel circuit configuration according to the embodiment 2. In the embodiment, for the sake of the miniaturization, the gate electrode of the reset transistor 108b and the gate electrode of the selection transistor 108c are formed with a common gate electrode and wiring. Furthermore, in the pixel circuit shown in FIG. 7, in order to drive the reset transistor 108b and the selection transistor 108c independently, the reset transistor 108b has a threshold voltage higher than that of the selection transistor 108c. Accordingly, it is possible to turn OFF the reset transistor 108b and turn ON the selection transistor 108c at a common gate voltage.

Embodiment 3

In an embodiment 3 according to the present disclosure, a variation of the embodiment 1 is described.

Figure 8:
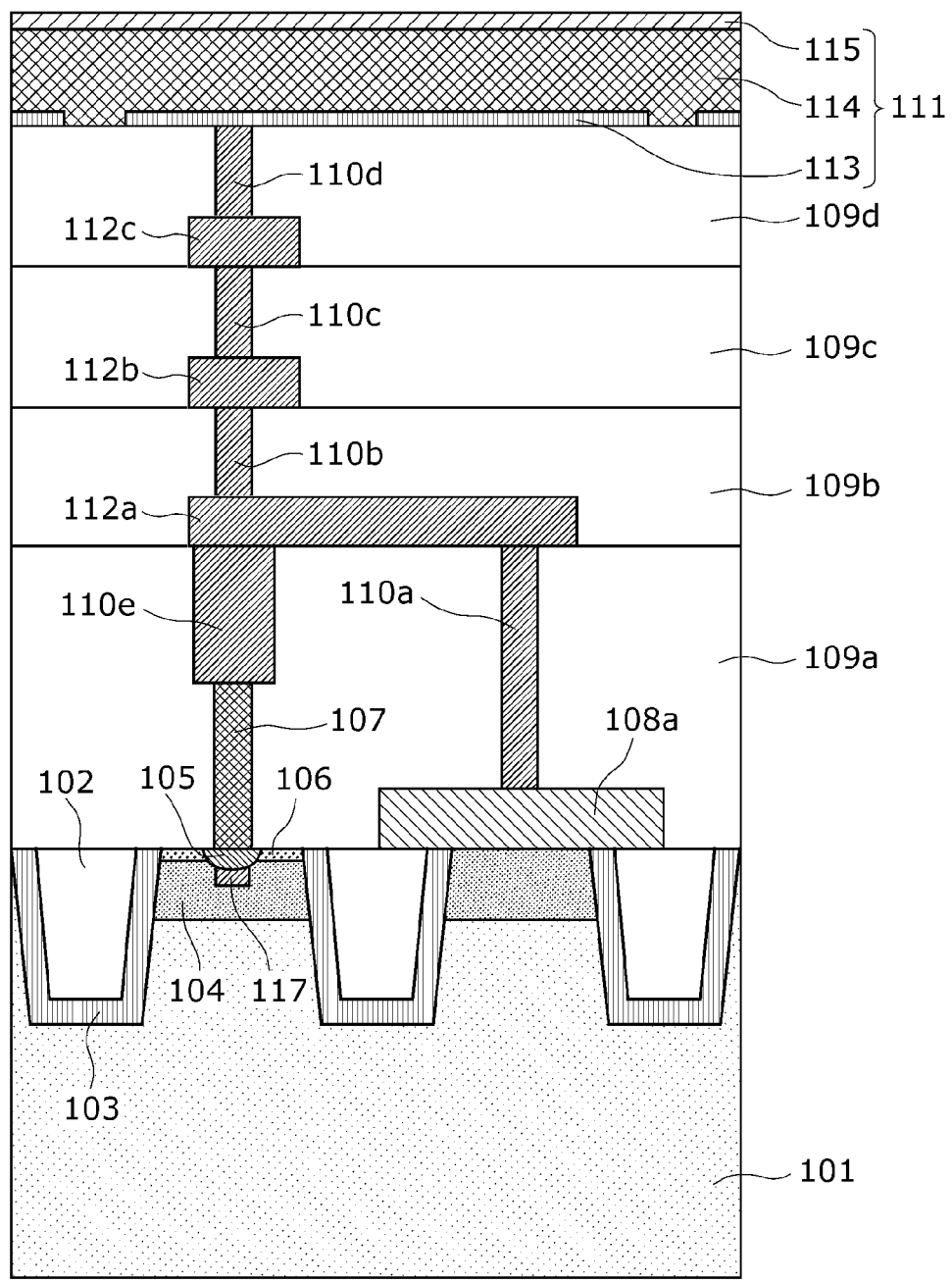
FIG. 8 illustrates a cross-sectional view of the solid-state imaging device according to an embodiment 3 of the present disclosure.

FIG. 8 illustrates a cross-sectional view of a structure including a charge accumulation region 104 and an amplification transistor 108a included in one pixel in the solid-state imaging device according to the embodiment 3. It should be noted that an element identical to that in FIG. 3 is numbered the same.

In a structure shown in FIG. 8, a P-type impurity region 106, a metal plug 110e, and an N-type impurity region 117 are added to the elements shown in FIG. 3.

Furthermore, in the embodiment, the metal plug 110e formed on the contact plug 107 comprising polysilicon has a width greater than that of the contact plug 107. With this, it is possible to prevent misalignment between them.

As described above, the solid-state imaging device according to the embodiment 3 further includes: a P-type impurity region 106 formed in a region not in contact with the contact plug at a surface of the charge accumulation region 104, and having a conductivity type opposite to a conductivity type of the charge accumulation region 104.

With this, in the charge accumulation region 104, the effect of the leakage current generated at the surface of a semiconductor substrate 101 on the charge accumulation region 104 is suppressed.

Here, when the P-type impurity region 106 makes it difficult to electrically connect the contact plug 107 and the charge accumulation region 104 to each other, supplementarily, an N-type impurity region 117 may be additionally formed by implanting impurity through a groove for forming the contact plug.

It should be noted that the other effects are the same as in the embodiment 1.

Manufacturing Method According to Embodiment 1

Referring to cross-sectional views as shown in FIG. 9A to FIG. 9E, a method of manufacturing the solid-state imaging device according to the foregoing embodiment 1 is described generally below.

Figure 9A:
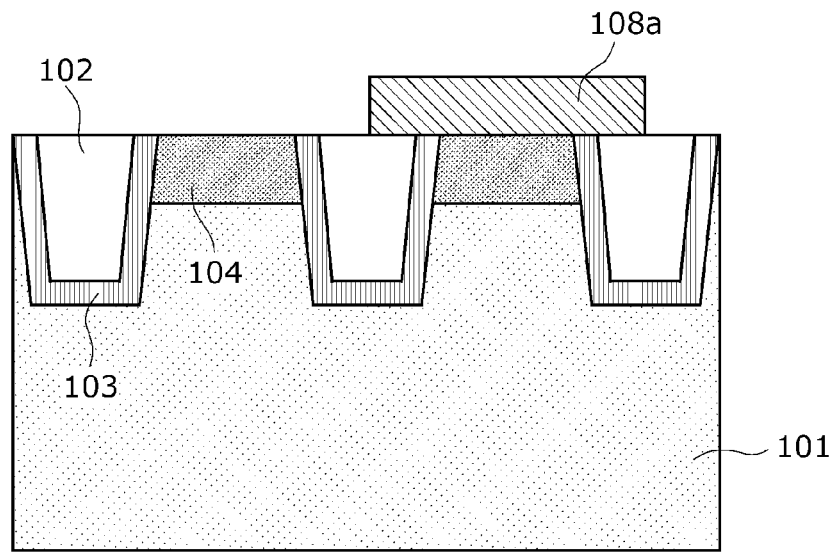
FIG. 9A illustrates a cross-sectional view showing a step in manufacturing the solid-state imaging device according to the embodiment 1 of the present disclosure.

First, as shown in FIG. 9A, using a general method of forming a layered solid-state imaging device, the element isolation region 102, the P-type impurity region 103 at the periphery of the element isolation region 102, and MOS transistors (the amplification transistor 108a, the reset transistor 108b, and the selection transistor 108c) each having the gate electrode are formed on the semiconductor substrate 101. At the same time as the formation of the MOS transistors, transistors included in a peripheral circuit for performing signal processing are also formed. Moreover, the N$^-$-type charge accumulation region 104 is formed by implanting ions.

Figure 9B:
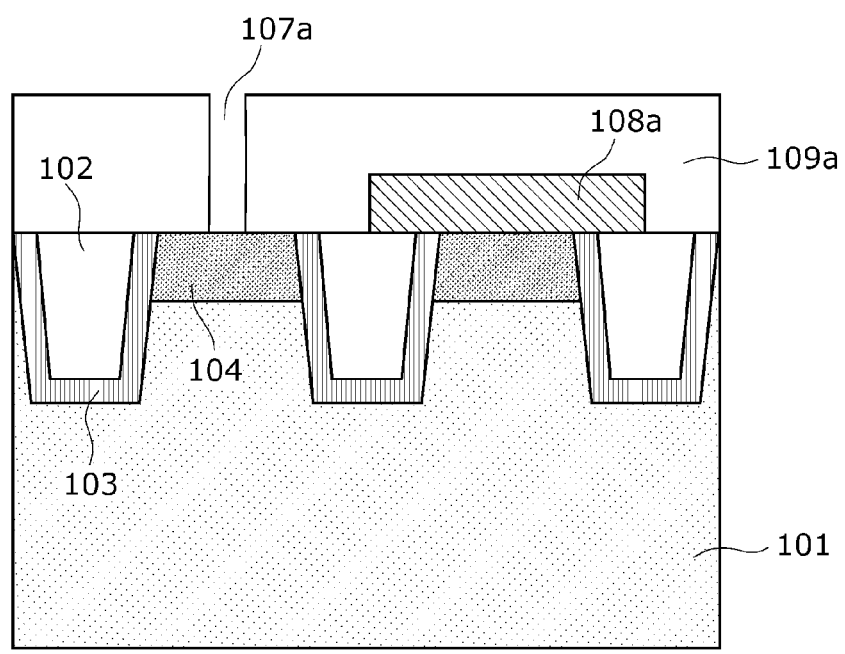
FIG. 9B illustrates a cross-sectional view showing a step in manufacturing the solid-state imaging device according to the embodiment 1 of the present disclosure.

Subsequently, as shown in FIG. 9B, the insulator layer 109a is deposited using a sputtering method or a CVD method. After this, a contact hole 107a is formed in the insulator layer 109a at a position where the wiring and the contact plug 107 comprising polysilicon having N$^+$-type impurities are to be formed.

Figure 9C:
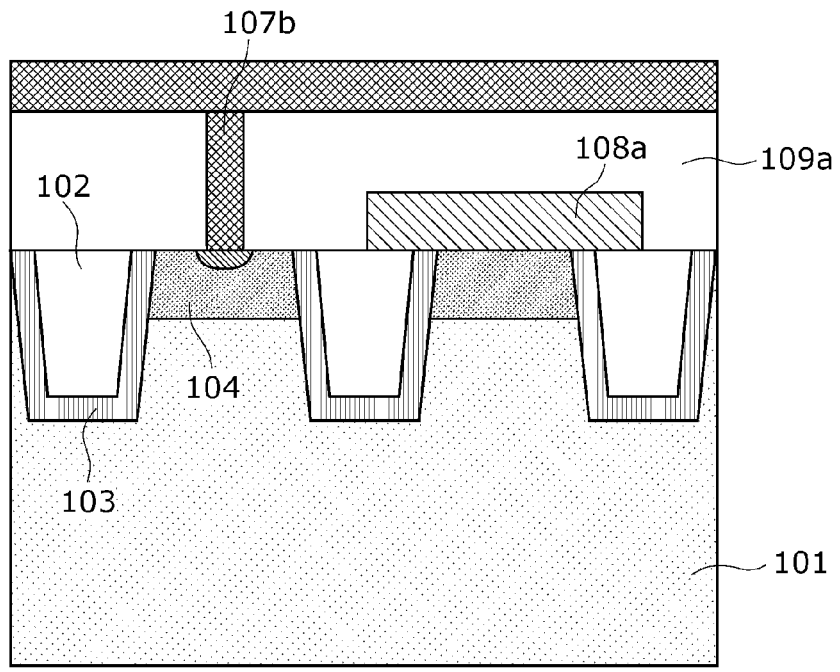
FIG. 9C illustrates a cross-sectional view showing a step in manufacturing the solid-state imaging device according to the embodiment 1 of the present disclosure.

Subsequently, as shown in FIG. 9C, the highly concentrated polysilicon having N-type impurities is deposited using the CVD method or the spattering method.

Figure 9D:
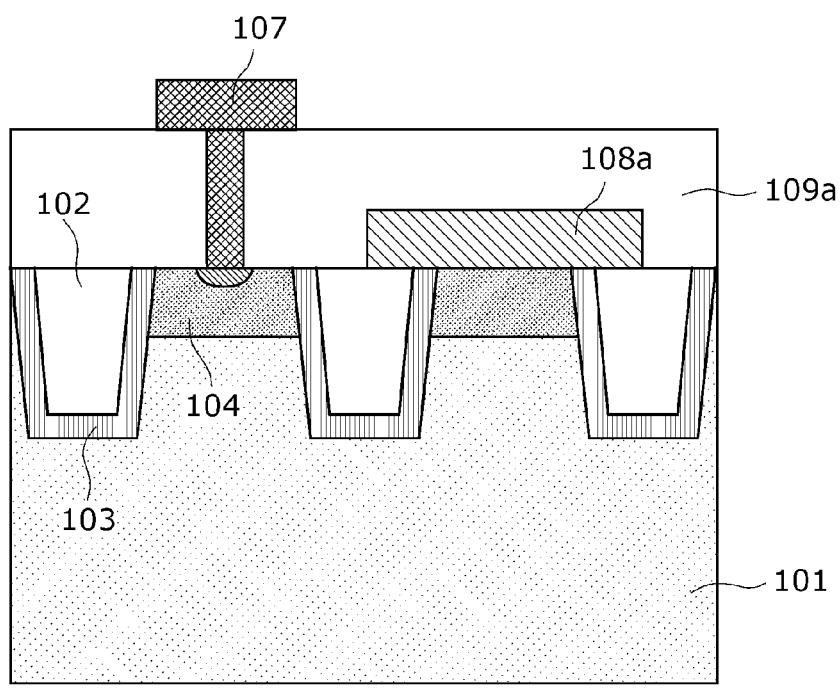
FIG. 9D illustrates a cross-sectional view showing a step in manufacturing the solid-state imaging device according to the embodiment 1 of the present disclosure.

Subsequently, as shown in FIG. 9D, a part of the polysilicon 107b is removed through an etching process to leave an interlayer having a minimum size required to be used as light shielding of the charge accumulation region 104 or to prevent misalignment. Then, after depositing an oxide film, the impurity diffusion layer 105 is formed through an annealing process at a high temperature of 700 to 900 degrees.

Figure 9E:
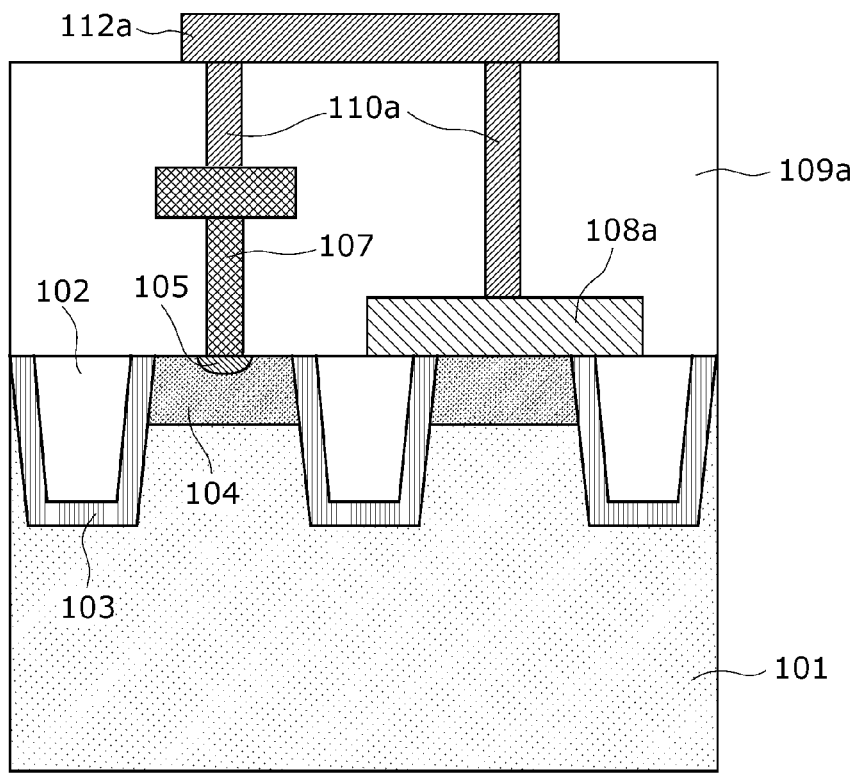
FIG. 9E illustrates a cross-sectional view showing a step in manufacturing the solid-state imaging device according to the embodiment 1 of the present disclosure.

Subsequently, as shown in FIG. 9E, the metal plug 110a and the wiring 112a are formed using a general method.

Subsequently, the structure shown in FIG. 3 is achieved by forming the metal plugs 110b to 110d, the wirings 112b to 112c, the insulator layers 109b to 109c, the first electrode 113, the photoelectric conversion film 114, the second electrode 115, a protection film (not shown), a color filter (not shown), and a lens (not shown). It should be noted that these manufacturing steps are the same as those of the conventional layered solid-state imaging device, and thus the detailed description is omitted here.

Manufacturing Method According to Embodiment 2

Referring to cross-sectional views as shown in FIG. 10A to FIG. 10E, a method of manufacturing the solid-state imaging device according to the foregoing embodiment 2 is described generally below.

Figure 10A:
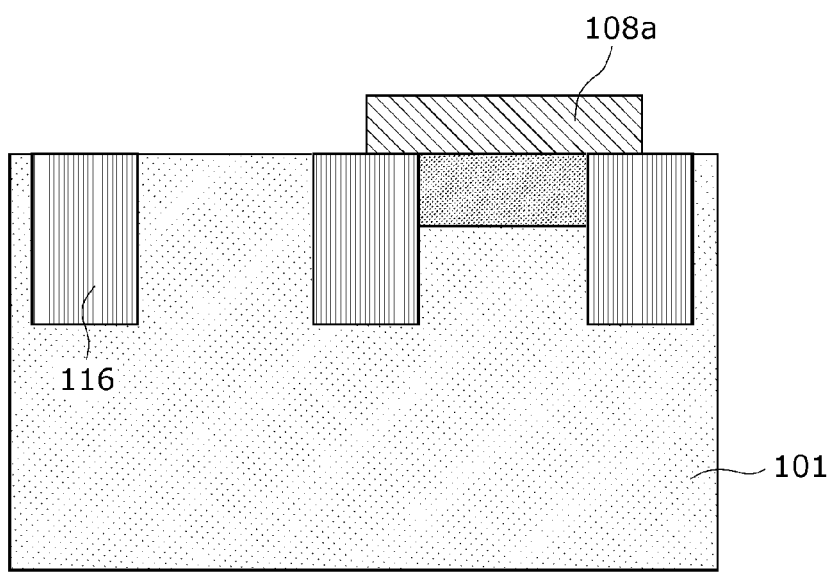
FIG. 10A illustrates a cross-sectional view showing a step in manufacturing the solid-state imaging device according to the embodiment 2 of the present disclosure.

First, as shown in FIG. 10A, using a general method of forming a layered solid-state imaging device, the P-type impurity region 116 and the MOS transistors (the amplification transistor 108a, the reset transistor 108b, and the selection transistor 108c) are formed on the semiconductor substrate 101. At the same time, a peripheral circuit for performing signal processing is also formed.

Figure 10B:
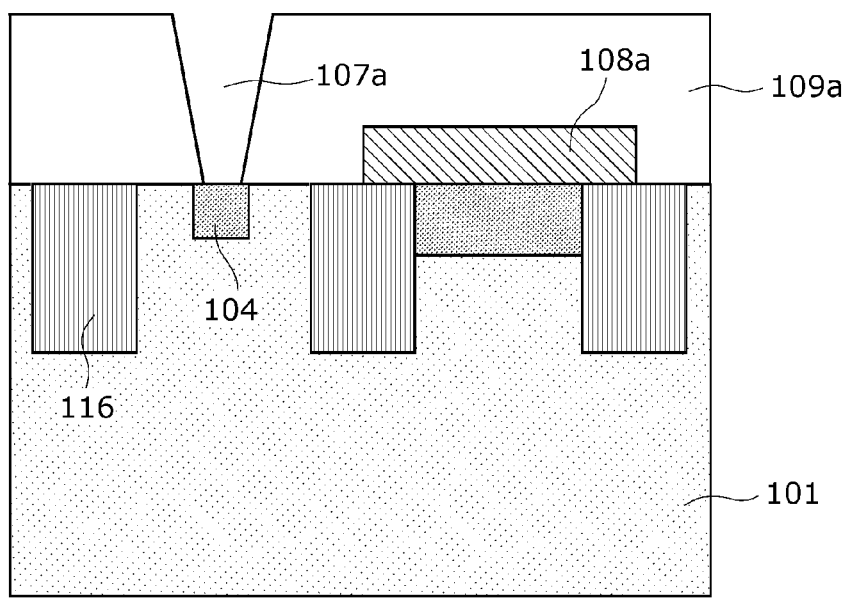
FIG. 10B illustrates a cross-sectional view showing a step in manufacturing the solid-state imaging device according to the embodiment 2 of the present disclosure.

Subsequently, as shown in FIG. 10B, the insulator layer 109a is deposited using a sputtering method or a CVD method. After this, a contact hole 107a is formed in the insulator layer 109a at a position where the wiring and the contact plug 107 comprising polysilicon having $N^+$-type impurities are to be formed. After this, the charge accumulation region 104 is formed by implanting N-type impurities through the contact hole 107a.

Figure 10C:
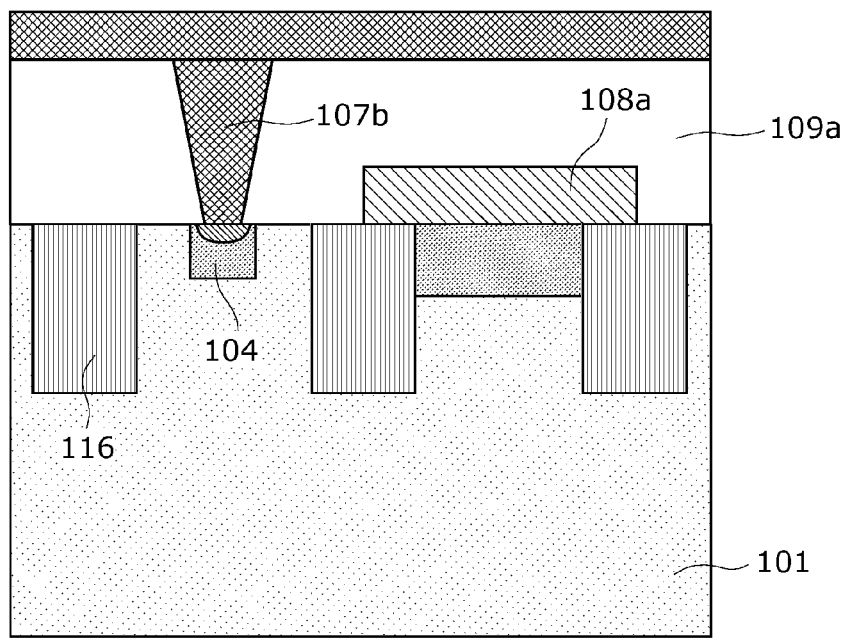
FIG. 10C illustrates a cross-sectional view showing a step in manufacturing the solid-state imaging device according to the embodiment 2 of the present disclosure.

Subsequently, as shown in FIG. 10C, the polysilicon 107b having $N^+$-type impurities is deposited using the CVD method or the spattering method.

Figure 10D:
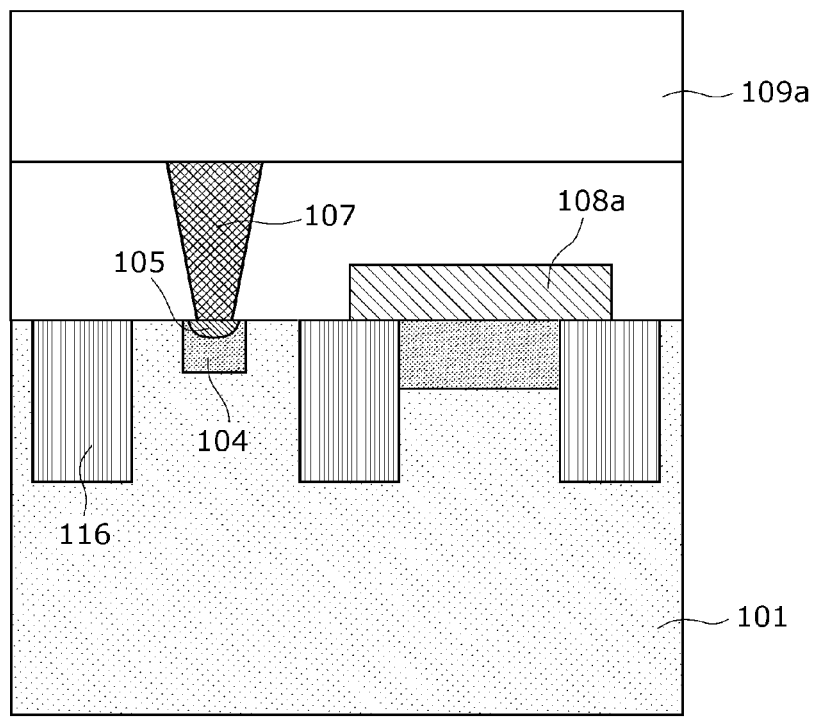
FIG. 10D illustrates a cross-sectional view showing a step in manufacturing the solid-state imaging device according to the embodiment 2 of the present disclosure.

Subsequently, as shown in FIG. 10D, a part of the polysilicon 107b is removed through a dry-etching process to leave an interlayer having a minimum size required to be used as light shielding of the charge accumulation region 104 or to prevent misalignment. Then, after depositing an oxide film, the impurity diffusion layer 105 is formed through an annealing process at a high temperature of 700 to 900 degrees.

Figure 10E:
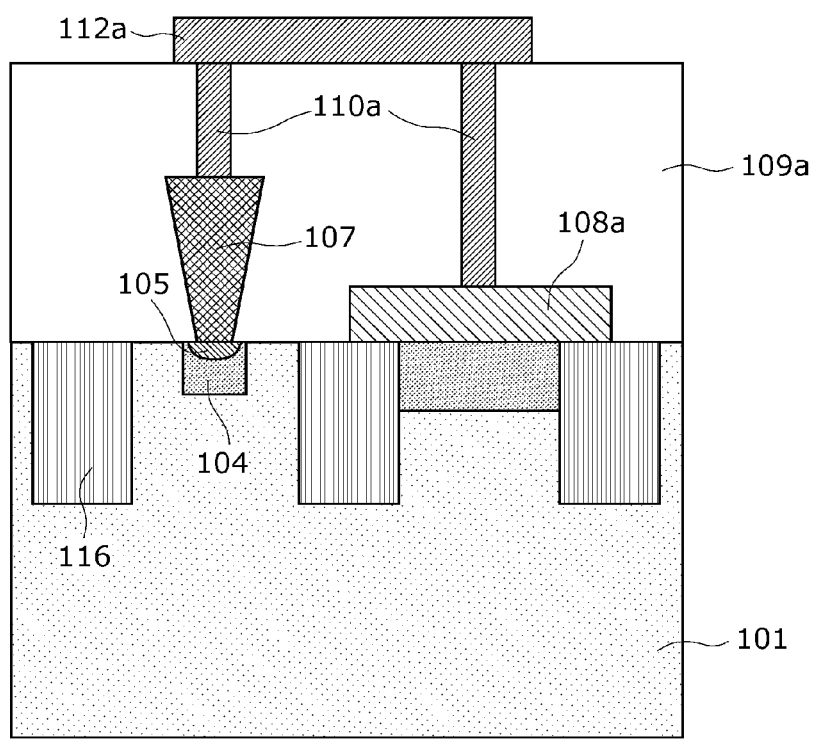
FIG. 10E illustrates a cross-sectional view showing a step in manufacturing the solid-state imaging device according to the embodiment 2 of the present disclosure.

Subsequently, as shown in FIG. 10E, the metal plug 110a and the wiring 112a are formed using a general method.

Subsequently, the structure shown in FIG. 6 is achieved by forming the metal plugs 110b to 110d, the wirings 112b to 112c, the insulator layers 109b to 109c, the first electrode 113, the photoelectric conversion film 114, the second electrode 115, a protection film (not shown), a color filter (not shown), and a lens (not shown). It should be noted that these manufacturing steps are the same as those of the conventional layered solid-state imaging device, and thus the detailed description is omitted here.

Manufacturing Method According to Embodiment 3

Referring to cross-sectional views as shown in FIG. 11A to FIG. 11E, a method of manufacturing the solid-state imaging device according to the foregoing embodiment 3 is described generally below.

Figure 11A:
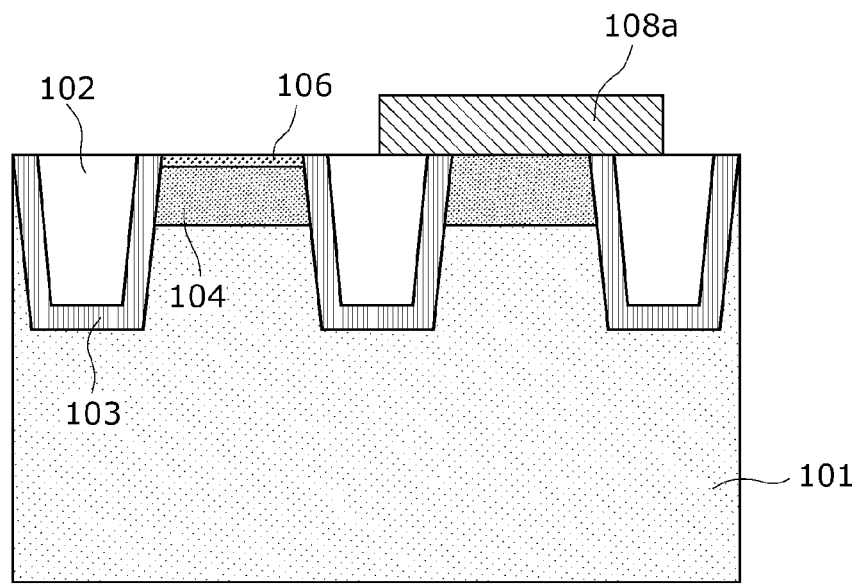
FIG. 11A illustrates a cross-sectional view showing a step in manufacturing the solid-state imaging device according to the embodiment 3 of the present disclosure.

First, as shown in FIG. 11A, using a general method of forming a layered solid-state imaging device, the P-type impurity region 116 and the MOS transistors (the amplification transistor 108a, the reset transistor 108b, and the selection transistor 108c) are formed on the semiconductor substrate 101. At the same time, a peripheral circuit for performing signal processing is also formed. In this step, the P-type impurity region 106 is formed on the charge accumulation region 104.

Figure 11B:
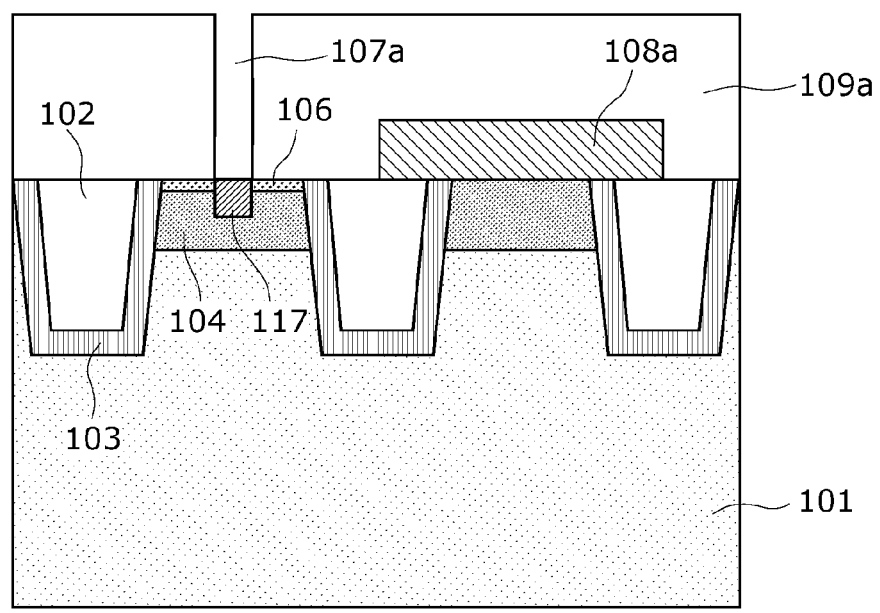
FIG. 11B illustrates a cross-sectional view showing a step in manufacturing the solid-state imaging device according to the embodiment 3 of the present disclosure.

Subsequently, as shown in FIG. 11B, the insulator layer 109a is deposited using a sputtering method or a CVD method. After this, a contact hole 107a is formed in the insulator layer 109a at a position where the wiring and the contact plug 107 comprising polysilicon having $N^+$-type impurities are to be formed. After this, the N-type impurity region 117 is formed by implanting N-type impurities through the contact hole 107a as needed.

Figure 11C:
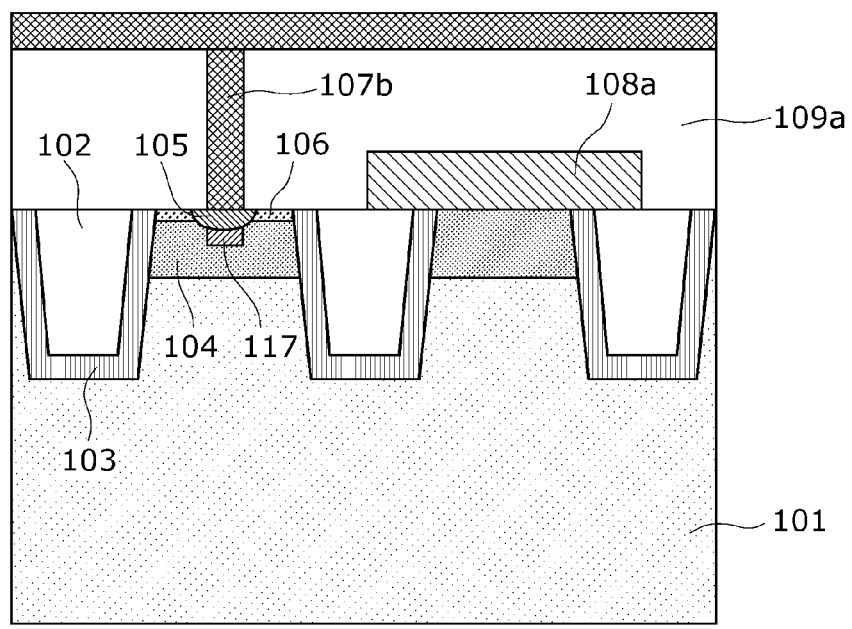
FIG. 11C illustrates a cross-sectional view showing a step in manufacturing the solid-state imaging device according to the embodiment 3 of the present disclosure.

Subsequently, as shown in FIG. 11C, the polysilicon 107b having $N^+$-type impurities is deposited using the CVD method or the spattering method.

Figure 11D:
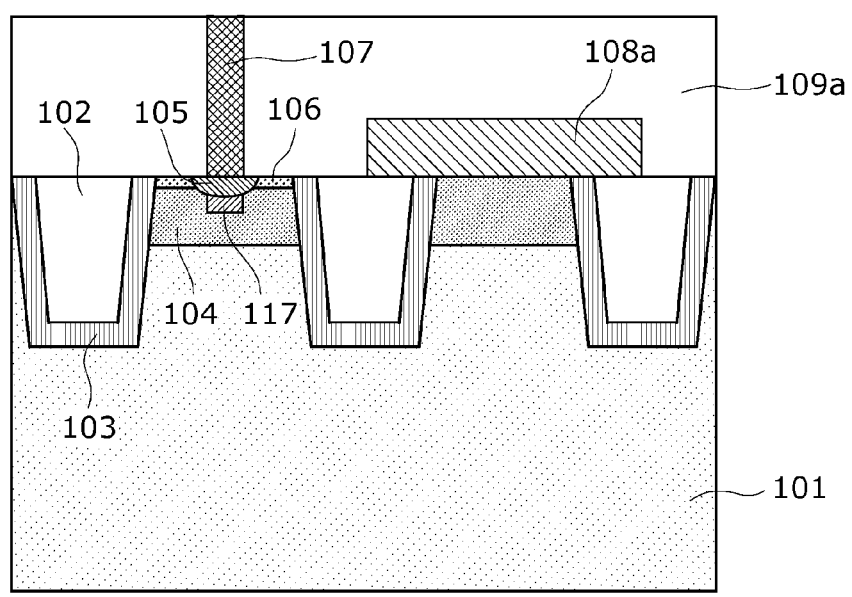
FIG. 11D illustrates a cross-sectional view showing a step in manufacturing the solid-state imaging device according to the embodiment 3 of the present disclosure.

Subsequently, as shown in FIG. 11D, a part of polysilicon is removed by polishing it through a CMP process to leave the contact plug 107. Then, after depositing an oxide film, the impurity diffusion layer 105 is formed through an annealing process at a high temperature of 700 to 900 degrees.

Figure 11E:
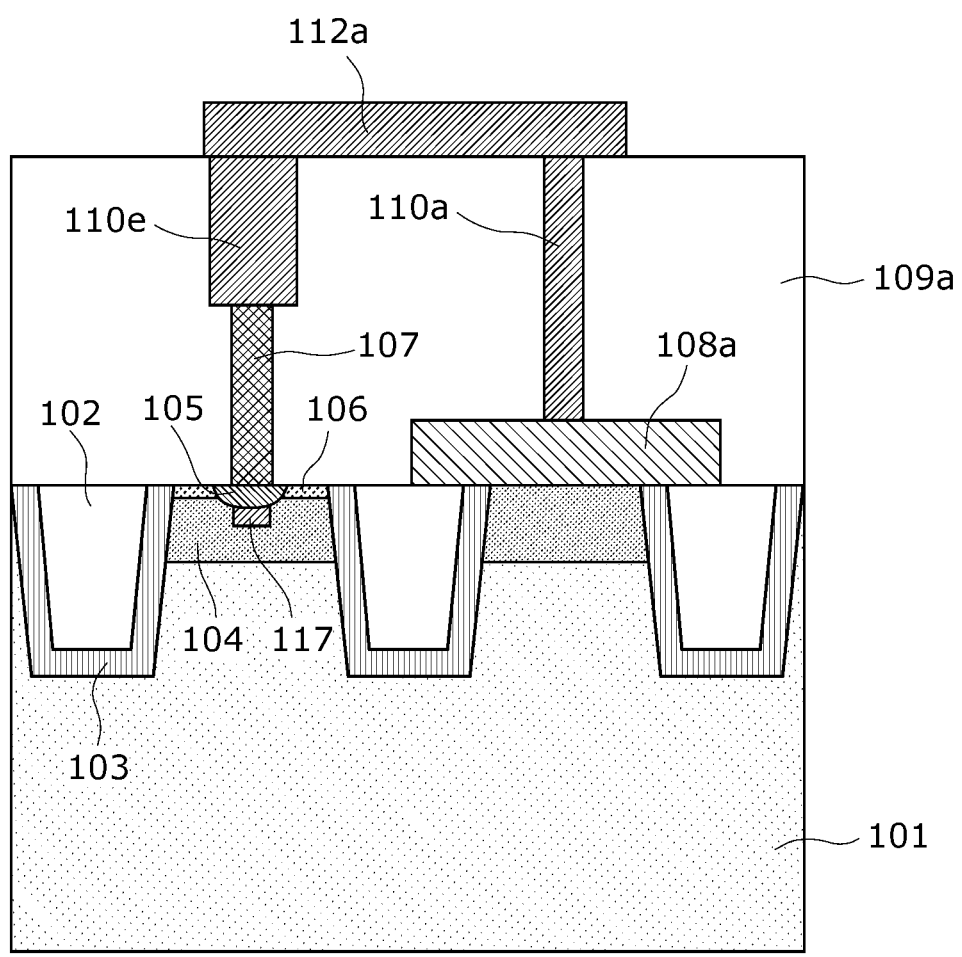
FIG. 11E illustrates a cross-sectional view showing a step in manufacturing the solid-state imaging device according to the embodiment 3 of the present disclosure.

Subsequently, as shown in FIG. 11E, the metal plugs 110a and 110e and the wiring 112a are formed using a general method. At this step, in order to prevent misalignment with the contact plug 107, the metal plug 110e is formed so as to have a width greater than that of the metal plug 110a.

Subsequently, the structure shown in FIG. 8 is achieved by forming the metal plugs 110b to 110d, the wirings 112b to 112c, the insulator layers 109b to 109c, the first electrode 113, the photoelectric conversion film 114, the second electrode 115, a protection film (not shown), a color filter (not shown), and a lens (not shown). It should be noted that these manufacturing steps are the same as those of the conventional layered solid-state imaging device, and thus the detailed description is omitted here.

(Imaging Apparatus Including Solid-State Imaging Device According to Embodiment)

The following describes an imaging apparatus (camera) including a solid-state imaging device described in any of the foregoing embodiments 1 to 3.

Figure 12:
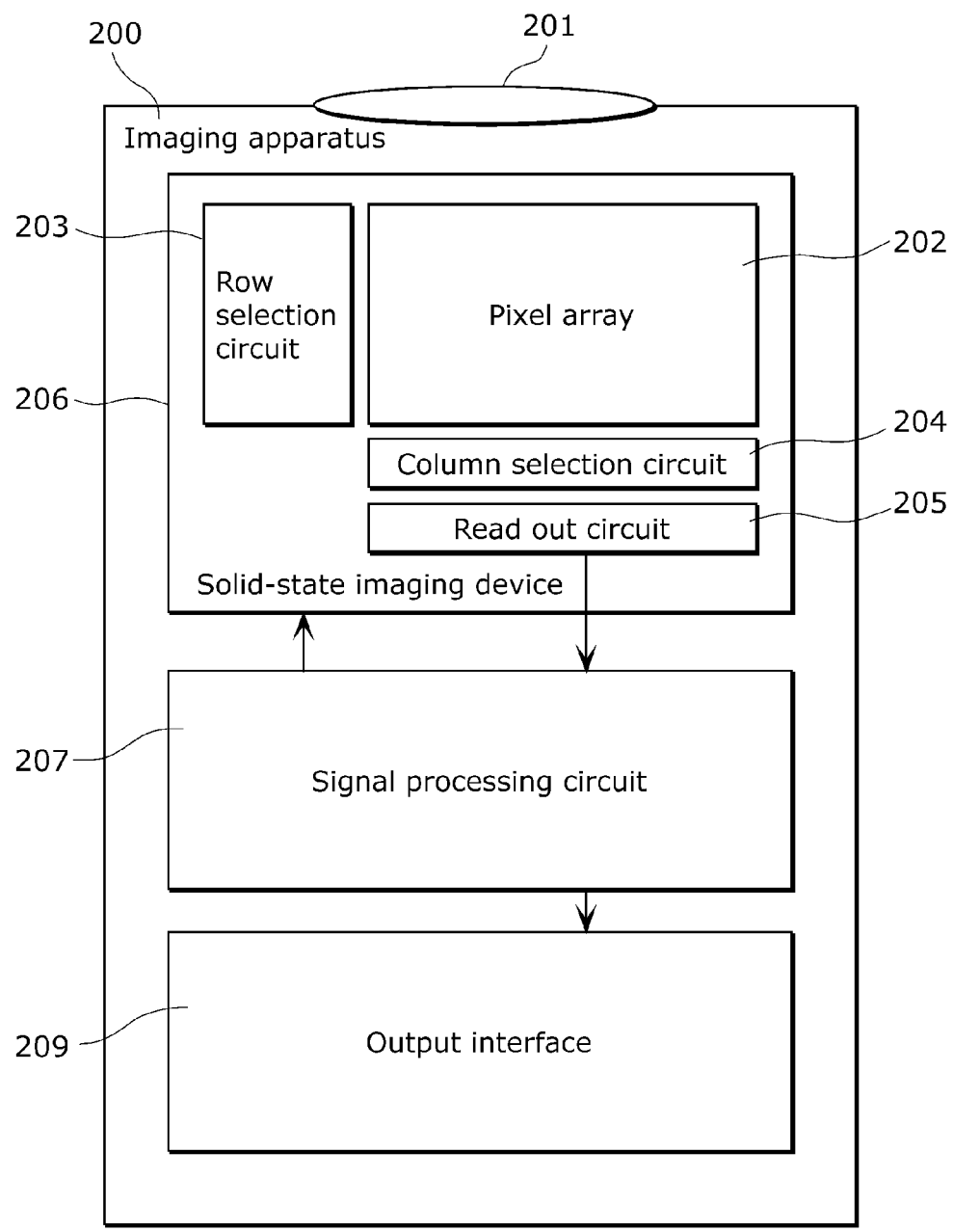
FIG. 12 illustrates an exemplary configuration of an imaging apparatus according to any of the embodiments of the present disclosure.
Figure 13:
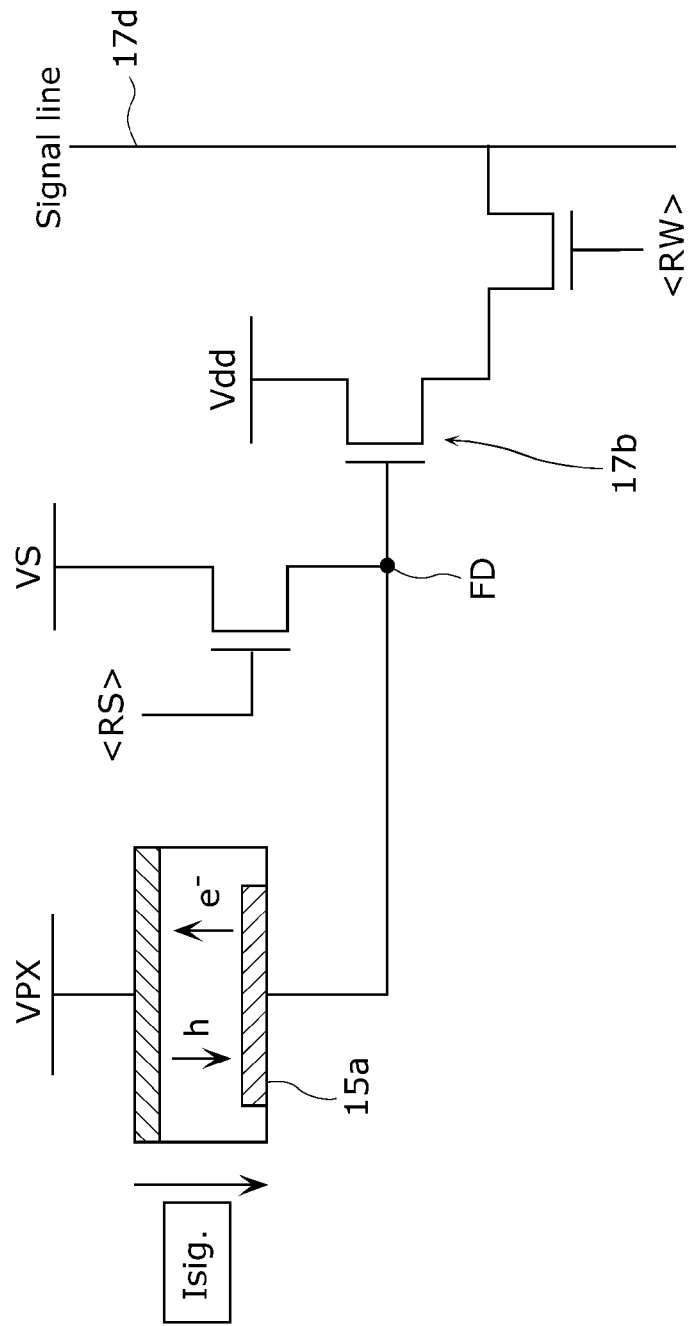
FIG. 13 illustrates a circuit diagram of a pixel circuit in a conventional layered solid-state imaging device.

FIG. 12 illustrates an overall configuration of the imaging apparatus 200 including the solid-state imaging device according to the embodiment. The imaging apparatus 200 including the solid-state imaging device according to the embodiment includes a lens 201, a solid-state imaging device 206, a signal processing circuit 207, and an output interface 209.

The solid-state imaging device 206 is a solid-state imaging device described in any of the foregoing embodiments 1 to 3. A pixel array 202 has the foregoing pixels 11 arranged in a matrix. A row selection circuit 203 and a column selection circuit 204 corresponds to the vertical scanning unit 13 and the horizontal scanning unit 15 shown in FIG. 1, respectively.

The lens 201 forms an image of an object on the pixel array 202. The signals obtained by the pixel array 202 are sequentially transmitted to the signal processing circuit 207 via the row selection circuit 203, the column selection circuit 204, and a read-out circuit 205. The signal processing circuit 207 performs signal processing on the received signal, and outputs the resulting image signal to the output interface 209 including a display and a memory.

The imaging apparatus and the solid-state imaging device according to the embodiment of the present disclosure are described above, but the present disclosure is not limited to the embodiment.

For example, the semiconductor substrate 101 in the foregoing description may be replaced with a well formed on the semiconductor substrate 101.

The solid-state imaging device according to the embodiment is typically implemented as a large-scale integration (LSI) circuit, which is an integrated circuit. These may be integrated into separate chips, or some or all of them may be integrated into a single chip.

The integration may be achieved, not only as a LSI, but also as a dedicated circuit or a general purpose processor. Also applicable is a field programmable gate array (FPGA), which allows post-manufacture programming, or a reconfigurable processor LSI, which allows post-manufacture reconfiguration of connection and setting of circuit cells therein.

In the foregoing cross-sectional views, the corner and the side of each constituent element are linearly drawn, but the constituent elements including round corners and curved sides in terms of the manufacturing process are also included in the present disclosure.

At least some of functions of the solid-state imaging device, the imaging apparatus, and modifications thereof according to any of the foregoing embodiments 1 to 3 may be combined.

All the figures used above are provided for purposes of illustration of the present disclosure, and the present disclosure is not limited to these figures. The logic levels represented as High/Low levels or the switching sates represented as ON/OFF are provided for purposes of illustration of the present disclosure, and an equivalent result can be obtained by a different combination of the logic levels or the switching states. The N-type and P-type of a transistor, an impurity region, and others are provided for purposes of illustration of the present disclosure, and an equivalent result can be obtained by reversing these types. All the materials of the foregoing constituent elements are examples for illustrating the present disclosure, and the present disclosure is not limited to these materials. The relation of connection between the constituent elements is an example for illustrating the present disclosure, and the relation of connection for achieving the functions of the present disclosure is not limited to this.

The partition of function blocks in the block diagram is an example, and the function blocks may be integrated into a single function block, a single function block may be divided into some blocks, and a part of the function may be transferred to another function block. A single hardware or software may process the functions of the function blocks having similar functions, in parallel or in a time division method.

In the foregoing description, MOS transistors are used as examples, but other transistors are possible.

Various modifications to the embodiments that can be conceived by those skilled in the art which are within the teachings of the present disclosure may be included in the scope of the present disclosure.

INDUSTRIAL APPLICABILITY

The present disclosure can be applied to a solid-state imaging device. The present disclosure also can be applied to an imaging apparatus including a solid-state imaging device, such as a digital still camera, a digital video camera, a mobile camera, a monitoring camera.

The invention claimed is:

1. A solid-state imaging device comprising:
a semiconductor substrate; and
pixels in a matrix, each of the pixels comprising:
a first electrode which is above the semiconductor substrate, and is electrically isolated from an adjacent one of the pixels;
a photoelectric conversion film which is on the first electrode, and converts light into signal charges;
a second electrode which is on the photoelectric conversion film;
a charge accumulation region which is in the semiconductor substrate, is electrically connected to the first electrode, and accumulates the signal charges;
an insulating film which is between the first electrode and the charge accumulation region;
a reset gate electrode which resets the charge accumulation region;
an amplification transistor which is in a transistor region, and amplifies the accumulated signal charges;
a contact plug which extends through the insulating film to electrically connect the first electrode to the charge accumulation region, and comprises first and second plugs, the second plug being in direct contact with the charge accumulation region, and comprising a semiconductor material;
an element isolation region which is in the semiconductor substrate, and isolates the charge accumulation region from the charge accumulation region in an adjacent one of the pixels and from the transistor region; and
an impurity region which is between the element isolation region and the charge accumulation region, and has a conductivity type opposite to a conductivity type of the charge accumulation region,
wherein the impurity region has a concentration of impurities that is higher than a concentration of impurities in the charge accumulation region, and lower than a concentration of impurities in the contact plug.

2. The solid-state imaging device according to claim 1, wherein the charge accumulation region has a conductivity type identical to a conductivity type of the semiconductor material included in the contact plug.

3. The solid-state imaging device according to claim 2, wherein a concentration of impurities determining the conductivity type of the semiconductor material is higher than a concentration of impurities determining the conductivity type of the charge accumulation region.

4. The solid-state imaging device according to claim 3, wherein:
the charge accumulation region includes a first layer and a second layer which is in the first layer, the second layer being an impurity diffusion layer in direct contact with the contact plug, and a concentration of impurities determining a conductivity type of the second layer is higher than a concentration of impurities determining a conductivity type of the first layer.

5. The solid-state imaging device according to claim 1, wherein the signal charges have polarities opposite to polarities of majority carriers determining a conductivity type of the charge accumulation region.

6. The solid-state imaging device according to claim 1, further comprising an impurity region formed in a region not in contact with the contact plug at a surface of the charge accumulation region, and having a conductivity type opposite to a conductivity type of the charge accumulation region.

7. The solid-state imaging device according to claim 1, wherein the contact plug has a bottom width smaller than a top width of the contact plug.

8. The solid-state imaging device according to claim 1, wherein the contact plug includes silicon or germanium.

9. The solid-state imaging device according to claim 1, further comprising a metal plug that is in contact with the contact plug and extends through the insulating film.

10. The solid-state imaging device according to claim 1, wherein the contact plug is formed of polysilicon.

11. The solid-state imaging device according to claim 9, wherein the metal plug is formed of W, Cu or Al.

12. A solid-state imaging device comprising:
a semiconductor substrate; and
pixels in a matrix, each of the pixels comprising:
a first electrode which is above the semiconductor substrate, and is electrically isolated from an adjacent one of the pixels;
a photoelectric conversion film which is on the first electrode, and converts light into signal charges;
a second electrode which is on the photoelectric conversion film;
a charge accumulation region which is in the semiconductor substrate, is electrically connected to the first electrode, and accumulates the signal charges;
an insulating film which is between the first electrode and the charge accumulation region;
a reset gate electrode which resets the charge accumulation region;
an amplification transistor which is in a transistor region, and amplifies the accumulated signal charges;
a contact plug which extends through the insulating film to electrically connect the first electrode to the charge accumulation region, and comprises first and second plugs, the second plug being in direct contact with the charge accumulation region, and comprising a semiconductor material;
an impurity region which is in the semiconductor substrate, and isolates the transistor regions from each other, and has a conductivity type opposite to a conductivity type of the charge accumulation region,
wherein the impurity region has a concentration of impurities that is higher than a concentration of impurities in the charge accumulation region, and lower than a concentration of impurities in the contact plug.

13. The solid-state imaging device according to claim 12, wherein the charge accumulation region has a conductivity type identical to a conductivity type of the semiconductor material included in the contact plug.

14. The solid-state imaging device according to claim 13, wherein a concentration of impurities determining the conductivity type of the semiconductor material is higher than a concentration of impurities determining the conductivity type of the charge accumulation region.

15. The solid-state imaging device according to claim 14, wherein:
the charge accumulation region includes a first layer and a second layer which is in the first layer, the second layer being an impurity diffusion layer in direct contact with the contact plug, and
a concentration of impurities determining a conductivity type of the second layer is higher than a concentration of impurities determining a conductivity type of the first layer.

16. The solid-state imaging device according to claim 12, wherein the signal charges have polarities opposite to polarities of majority carriers determining a conductivity type of the charge accumulation region.

17. The solid-state imaging device according to claim 12, further comprising an impurity region formed in a region not in contact with the contact plug at a surface of the charge accumulation region, and having a conductivity type opposite to a conductivity type of the charge accumulation region.

18. The solid-state imaging device according to claim 12, wherein the contact plug has a bottom width smaller than a top width of the contact plug.

19. The solid-state imaging device according to claim 12, wherein the contact plug includes silicon or germanium.

20. The solid-state imaging device according to claim 12, further comprising a metal plug that is in contact with the contact plug and extends through the insulating film.

21. The solid-state imaging device according to claim 12, wherein the contact plug is formed of polysilicon.

22. The solid-state imaging device according to claim 20, wherein the metal plug is formed of W, Cu or Al.

* * * * *